US012446178B2

(12) United States Patent
Lee et al.

(10) Patent No.: US 12,446,178 B2
(45) Date of Patent: Oct. 14, 2025

(54) ELECTRONIC DEVICE EJECTION MECHANISM WITH SELECTIVELY DISABLEABLE EJECTION FUNCTION

(71) Applicants: HEWLETT PACKARD ENTERPRISE DEVELOPMENT LP, Spring, TX (US); Southco, Inc., Concordville, PA (US)

(72) Inventors: Brian Eunsup Lee, Suisun City, CA (US); Vance Brey Murakami, Los Gatos, CA (US); Harold Zin Htutt, Fremont, CA (US); Richard E. Schlack, Newark, DE (US)

(73) Assignees: Hewlett Packard Enterprise Development LP, Spring, TX (US); Southco, Inc., Concordville, PA (US)

( * ) Notice: Subject to any disclaimer, the term of this patent is extended or adjusted under 35 U.S.C. 154(b) by 272 days.

(21) Appl. No.: 18/146,006

(22) Filed: Dec. 23, 2022

(65) Prior Publication Data

US 2024/0215192 A1 Jun. 27, 2024

(51) Int. Cl.
*H05K 7/14* (2006.01)
(52) U.S. Cl.
CPC ................... *H05K 7/1401* (2013.01)
(58) Field of Classification Search
CPC ........... H05K 7/20154; H05K 7/20172; H05K 7/20409; H05K 7/20445; H05K 7/1401;
(Continued)

(56) References Cited

U.S. PATENT DOCUMENTS 7,297,008 B2 * 11/2007 Griffin ................. H05K 7/1409
439/157
7,874,776 B1 * 1/2011 Lam ..................... H05K 7/1407
439/157
(Continued)

OTHER PUBLICATIONS

Cisco Systems, Inc., "Cisco Nexus 7710 Switch Site Preparation and Hardware Installation Guide," Installing or Replacing Modules, Fan Trays, and Power Supplies, Jul. 10, 2019, pp. 54. https://www.cisco.com/c/en/us/td/docs/switches/datacenter/hw/nexus7000/installa.
(Continued)

*Primary Examiner* — Imani N Hayman
*Assistant Examiner* — Hung Q Dang
(74) *Attorney, Agent, or Firm* — Jones Robb, PLLC

(57) ABSTRACT

An electronic device may comprise a chassis and an ejection mechanism coupled to the chassis. The chassis can house an electronic component and can be removably received within a system chassis of an electronic system. The ejection mechanism may be reversibly configurable between a first state and a second state. When the chassis is in an installed position in the system chassis and in the first state, actuation of an actuatable portion of the ejection mechanism from a first position to a second position moves the chassis from the installed position into an ejected position relative to the system chassis. But when the chassis is in the installed position in the system chassis and in the second state, actuation of the actuatable portion of the ejection mechanism from the first position to the second position does not move the device into the ejected position relative to the system chassis.

16 Claims, 13 Drawing Sheets

(58) Field of Classification Search
CPC .. H05K 5/0217; H05K 5/0247; H05K 7/1092; G06F 1/1681; G06F 1/203; G06F 2200/202; G06F 1/1616; G06F 1/183; H01R 13/10; H01R 43/00
See application file for complete search history.

(56) References Cited

U.S. PATENT DOCUMENTS

| | | | | |
|---|---|---|---|---|
| 8,416,563 | B2* | 4/2013 | Hou | H05K 7/1489 361/679.33 |
| 8,611,103 | B2* | 12/2013 | Thomas | H05K 7/1489 361/801 |
| 9,730,356 | B2* | 8/2017 | Franz | G11B 33/1426 |
| 10,058,006 | B2* | 8/2018 | Hung | H05K 5/0221 |
| 10,117,350 | B2* | 10/2018 | Kuang | H05K 7/1409 |
| 10,206,302 | B2* | 2/2019 | Liao | G06F 1/183 |
| 2013/0130528 | A1* | 5/2013 | Jun | H05K 7/1409 439/160 |
| 2019/0075666 | A1* | 3/2019 | Ehlen | H05K 7/1487 |

OTHER PUBLICATIONS

Fivetech Technology Inc., "Ejector Handle," Apr. 14, 2019, pp. 1. https://www.fivetk.com/products_overview_detail_page/index.php?id=187&m_id=37&s_id=96.

Hewlett Packard Enterprise, "XL740f_Gen9," retrieved online Jul. 12, 2022, pp. 2. https://techlibrary.hpe.com/docs/iss/XL740f_Gen9/setup_install/233061.htm.

* cited by examiner

ELECTRONIC DEVICE EJECTION MECHANISM WITH SELECTIVELY DISABLEABLE EJECTION FUNCTION

INTRODUCTION

Some electronic systems (such as computer servers, data storage systems, networking systems, high-performance compute (HPC) systems, converged systems, hyperconverged systems, composable infrastructure systems, and other types of electronic systems) comprise multiple distinct electronic devices (such as server nodes, network switches, input-output modules, power supply units, and other types of electronic devices) that are communicably connected to one another. In some cases, the electronic system may comprise a system chassis and some of the electronic devices that make up the system may be removably housed within the system chassis. In particular, some of the electronic devices may have their own individual device chassis, which is configured to be removably received within the larger system chassis. The electronic devices may removably couple with electrical connectors in the system chassis when received therein to establish electrical connections with the rest of the system. Some of the individual electronic devices may also be configured to receive additional pluggable electronic devices therein, such as host-bus-adaptors, pluggable optical transceiver modules, electrical or optical cable connectors, PCIe cards, solid state drives, and other pluggable electronic devices.

To facilitate removal of the individual electronic devices from and/or installation of the devices in the system chassis, some electronic devices comprise an ejection mechanism. The ejection mechanism engages with the system chassis and can be manually actuated to cause the electronic device to move relative to the system chassis. Specifically, actuation of the ejection mechanism in one direction causes ejection of the electronic device, i.e., causes the electronic device to be detached from the system chassis and electrically disconnected from the system. In some cases, actuation of the ejection mechanism in a second direction may cause the electronic device to move to an installed position and/or become attached to the system chassis and electrically connected to the system.

BRIEF DESCRIPTION OF THE DRAWINGS

The present disclosure can be understood from the following detailed description, either alone or together with the accompanying drawings. The drawings and related description of the figures are included to provide a further understanding of the present disclosure and are incorporated in and constitute a part of this specification. The drawings illustrate one or more nonlimiting aspects and implementations of the present teachings and together with the description explain certain principles and operation. In the drawings.

DETAILED DESCRIPTION

Figure 1A:
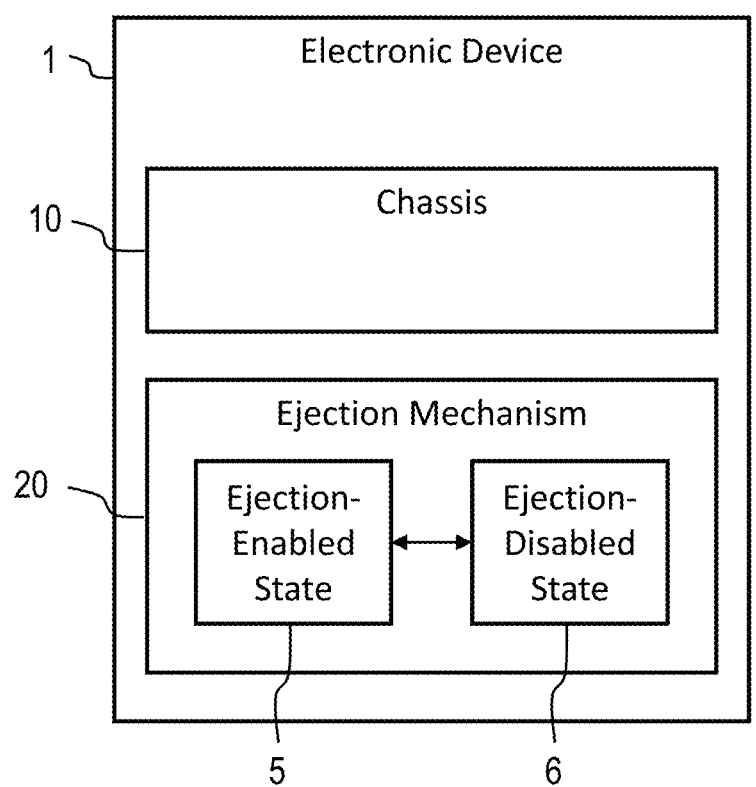
FIG. 1A is a block diagram illustrating an electronic device comprising an ejection mechanism.

Some electronic devices that are configured to be removably installed in a larger system have parts that are intended to be accessible to a user while the electronic device is in an installed state in the larger system. An example of such an externally accessible part is a receptacle for removably receiving a pluggable device or a connector. In some circumstances, these externally accessible parts are disposed at the same portion of the electronic device as the ejection mechanism thereof (e.g., at a rear face). The space in this portion of the device in which these various externally accessible parts can be arranged may be limited. Thus, in some cases, the ejection mechanism may end up being positioned in a manner that causes it to interfere with the ability of a user to access certain other parts of the device. In particular, an actuatable portion of the ejection mechanism that a user can grasp and actuate (i.e., impart motion to) in order to drive the ejection function may be positioned so as to interfere with accessibility of the other parts. For example, in some cases the actuatable portion may fully or partially overlap with (and hence block access to) another part (e.g., receptacle), thus preventing access to the part (e.g., preventing installation or removal of a pluggable device in the receptacle). As another example, in some cases the actuatable portion might not overlap with the other part but may nevertheless interfere with access to the part by virtue of being located very close to the other part and thus making it difficult for a user to grasp, install, remove, or otherwise manipulate the other part.

One way to provide access to a part that is otherwise blocked by an actuatable portion of an ejection mechanism is to manually move the actuatable portion out of the way of the blocked part when it is desired to access the blocked part (e.g., to insert or remove a pluggable device). However, in some cases such movement of the actuatable portion of the ejection mechanism causes the electronic device to be ejected from the system chassis. Such ejection of the electronic device from the system chassis and the resultant electrical disconnection of the electronic device from the system may not be desired in some circumstances. For example, it may be desired in some circumstances to allow for "hot-swapping" of pluggable devices into or out of the electronic device, which involves installing or removing the pluggable devices while the electronic device remains powered and operational. As another example, it may be desired in some circumstances to keep pluggable devices that are already installed in the electronic device powered on and operational while installing or removing another pluggable device.

Thus, according to aspects of the present disclosure, ejection mechanisms are utilized that can be selectively and reversibly reconfigured between two states: an ejection-enabled state and an ejection-disabled state. When in the ejection-enabled state, actuation of (i.e., imparting of motion to) an actuatable portion of the ejection mechanism causes ejection of the electronic device. However, when in the ejection-disabled state, actuation of the actuatable portion of the ejection mechanism can occur without causing ejection of the electronic device. Such selectively reconfigurable ejection mechanisms can facilitate accessibility in electronic devices in which the actuatable portion of the ejection mechanism is positioned so as to potentially interfere with accessibility of another part. That is, when the other part needs to be accessed, the ejection mechanism can be transitioned to the ejection-disabled state and then the actuatable portion can be moved out of the way of the other part. Because the ejection mechanism is in the ejection-disabled state, however, the movement of the actuatable portion does not cause ejection of the electronic device. Thus, access to the other part can be provided relatively easily while also maintaining the electronic device in an installed state in the system.

In some implementations, an ejection mechanism comprises an engagement portion that engages with the system chassis to drive motion of the electronic device relative to the system chassis, as well as a link that can either operably couple or not operably couple the actuatable portion to the engagement portion depending on the state of the link. In particular, the link is transitionable between two states. In a first state of the link (corresponding to the ejection-enabled state of the ejection mechanism), the link operably couples the actuatable portion to the engagement portion such that actuation of the actuatable portion causes actuation of the engagement portion and consequently ejection of the electronic device. In a second state of the link (corresponding to the ejection-disabled state of the ejection mechanism), the link does not operably couple the actuatable portion to the ejection mechanism, and actuation of the actuatable portion does not cause actuation of the engagement portion, and thus no ejection occurs. In some implementations, the actuatable portion comprises a lever arm and the engagement portion comprises a cam, with the link operably coupling the lever arm to the cam in the ejection-enabled state such that pivoting of the lever arm drives pivoting of the cam.

In some implementations, the link comprises a button, and the state of the ejection mechanism is changed by moving the button (e.g., by pressing or releasing the button). Specifically, in some implementations the button is placed in the first state (corresponding to the ejection-enabled state of the ejection mechanism) when the button is in a raised position and the button is placed in the second state (corresponding to the ejection-disabled state of the ejection mechanism) when the button is in a depressed position. When the button is in the raised position (the first state of the link and the ejection-enabled state of the ejection mechanism), the button interferes with the actuatable portion such that the actuatable portion comes into contact with the button as the actuatable portion is actuated, and this contact causes the button to move along with the actuatable portion. Because the button is also coupled to the engagement portion, the motion of the button also causes motion of the engagement portion and consequently ejection of the electronic device. In other words, in the first state the button converts the motion of the actuatable portion into motion of the engagement portion. On the other hand, when the button is in the depressed position (the second state of the link and ejection-disabled state of the ejection mechanism), the actuatable portion is able to move freely past (e.g., over) the button without colliding therewith, and thus actuation of the actuatable portion does not cause motion of the engagement portion. In addition, the button may have one or more features that engage with the electronic device when the button is depressed to prevent the button, and hence the engagement portion, from moving relative to the electronic device.

Turning now to the figures, various devices, systems, and methods in accordance with nonlimiting aspects of the present disclosure will be described.

FIG. 1A is a block diagram conceptually illustrating an electronic device 1. It should be understood that FIG. 1A is not intended to illustrate specific shapes, dimensions, or other structural details accurately or to scale, and that implementations of the electronic device 1 may have different numbers and arrangements of the illustrated components and may also include other parts that are not illustrated.

As shown in FIG. 1A, the electronic device 1 comprises a chassis 10 and an ejection mechanism 20. The electronic device 1 may be a computing device (e.g., an input-output module (IOM) of a data storage system, a server node, a blade of a blade server, or any other type of computing device), a network device (e.g., a switch, a router, or any other type of networking device), a power supply device, or any other type of electronic device. The electronic device 1 is configured to be installed in (e.g., received within) a system chassis of a larger system.

The chassis 10 comprises one or more support structures, such as walls, platforms, and other similar structures, that support and/or house various components of the electronic device 1. For example, the chassis 10 may comprise sheet metal walls that define a partially or fully enclosed housing. The chassis 10 may house electronic components, such as, but not limited to, a processor, accelerator, controller, memory device, or other electronic circuitry. The ejection mechanism 20 is coupled to the chassis 10.

The ejection mechanism 20 can be selectively and reversibly reconfigured between two states: an ejection-enabled state 5 (also referred to as a "first state") and an ejection-disabled state 6 (also referred to as a "second state"). When the electronic device 1 is in an installed position within a system chassis and the ejection mechanism 20 is in the ejection-enabled state 5, actuation of the ejection mechanism 20 causes ejection of the electronic device 1 from the system chassis, i.e., it causes movement of the electronic device 1 from the installed position to an ejected position. In contrast, when the electronic device 1 is in the installed position within the system chassis but the ejection mechanism 20 is in the ejection-disabled state 6, the ejection mechanism 20 can be actuated without causing such ejection of the electronic device 20, i.e., without causing movement of the electronic device 1 relative to the system chassis. Actuation of the ejection mechanism 20 refers to moving at least a portion of the ejection mechanism 20 (e.g., a handle, lever, button, knob, crank, or other actuatable element).

The installed position refers to a position in which the electronic device 1 is electrically coupled with the system (e.g., via a connector in the system chassis which is engaged with a connector of the electronic device 1). In addition, in the installed position the electronic device 1 may be attached to the system, meaning the device 1 is physically engaged with the system in a manner that prevents or resists removal of the electronic device 1 from the system chassis. For example, a portion of the electronic device 1 (for example, a part of the ejection mechanism 20) may engage with the system chassis (or vice versa) so as to physically interfere therewith and thus prevent relative motion therebetween. As another example, friction engagement (e.g., between coupled electrical connectors of the electronic device 1 and the system) may generate friction forces that resist removal of the electronic device 1.

In contrast, the ejected position refers to a position in which the electronic device 1 is electrically disconnected from the system. Moreover, in the ejected position the electronic device 1 may also be physically detached from the system, meaning that the electronic device 1 is no longer physically engaged with the system in a manner that prevents or resists removal. But the ejected position is not necessarily a position in which the electronic device 1 is fully removed from the system chassis; in other words, in the ejected position a portion of the electronic device 1 may remain within, and may be engaged with, the system chassis 1.

Causing movement of the electronic device 1 from the installed position to the ejected position may include detaching the electronic device 1 from the system and physically moving the electronic device 1 relative to the system chassis (e.g., in a direction of removal of the electronic device 1 from the system chassis). The ejection mechanism 20 may be configured to convert the forces applied thereto by a user as part of actuating the ejection mechanism 20 into forces applied to the electronic device 1 and/or system chassis that cause relative motion therebetween. Moreover, the actuation of the ejection mechanism 20 may cause a part of the electronic device 1 that prevents removal of the electronic device 1 (e.g., a portion of the ejection mechanism 20 that engages the system chassis) to move so that it no longer prevents removal of the electronic device 1.

In some implementations, the ejection mechanism 20 may have multiple modes of actuation that cause the ejection mechanism 20 to perform different functions. For example, the modes of actuation may include moving at least a portion of the ejection mechanism 20 in different directions, with each direction of movement causing a different function. For example, in some implementations movement of the ejection mechanism 20 in one direction (e.g., movement from a first position to a second position) causes ejection of the electronic device 1 as already described above, while movement of the ejection mechanism 20 in an opposite direction (e.g., movement from the second position to the first position) causes the electronic device 1 to move from an ejected position (partially inserted into the system chassis but not yet fully installed) into the installed position. The ejection mechanism 20 may cause such motion by engagement with the system chassis in a manner similar to that described above in relation to the ejection function, except that in the case of installation the motion of each element is in an opposite direction.

Figure 1B:
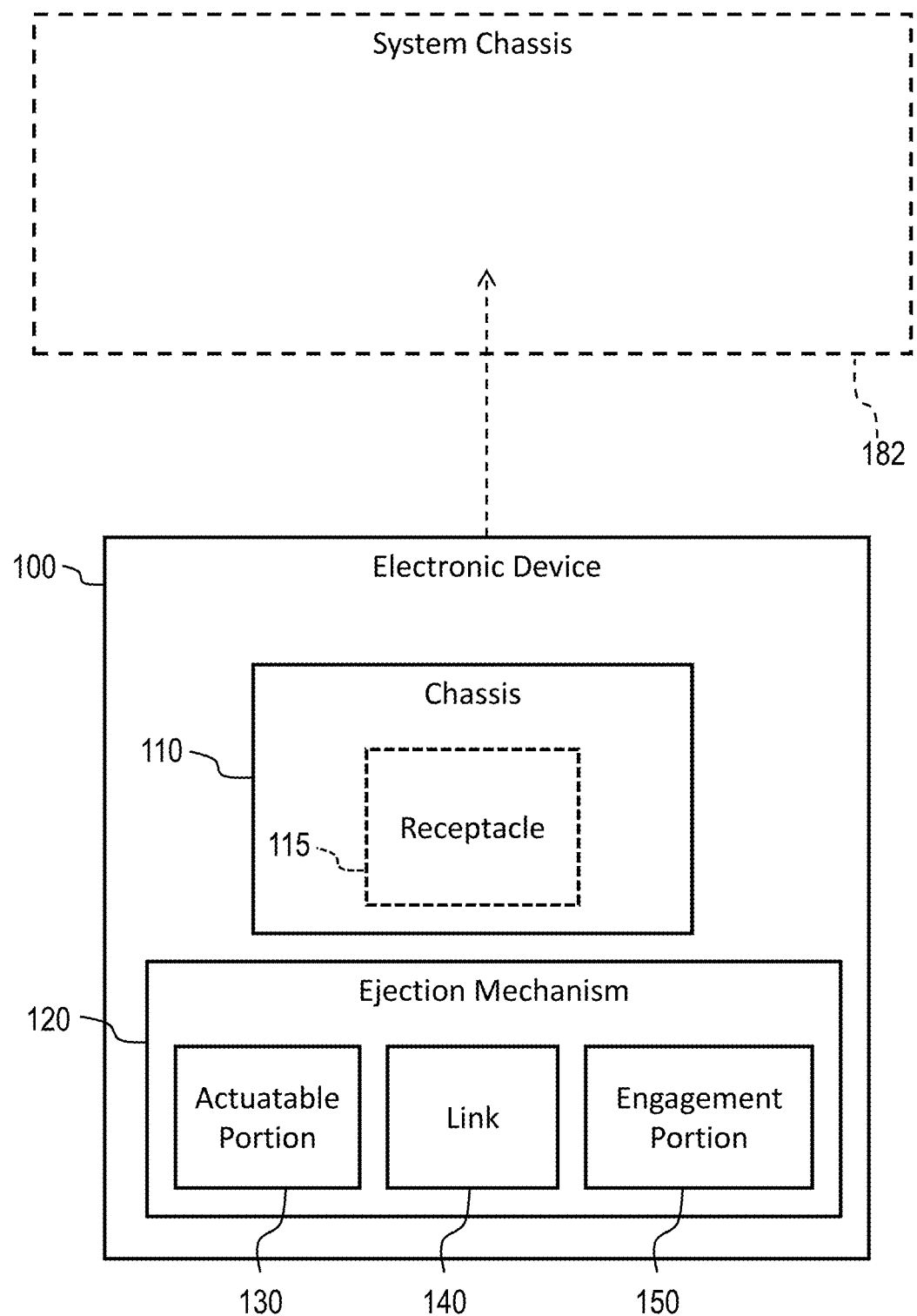
FIG. 1B is a block diagram illustrating another electronic device comprising an ejection mechanism.

FIG. 1B is a block diagram conceptually illustrating an electronic device 100. It should be understood that FIG. 1B is not intended to illustrate specific shapes, dimensions, or other structural details accurately or to scale, and that implementations of the electronic device 100 may have different numbers and arrangements of the illustrated components and may also include other parts that are not illustrated. The electronic device 100 is one configuration of the electronic device 1 described above, but the electronic device 1 is not limited to the electronic device 100.

As shown in FIG. 1B, the electronic device 100 comprises a chassis 110 and an ejection mechanism 120. The electronic device 100 may be a computing device (e.g., an input-output module (IOM) of a data storage system, a server node, a blade of a blade server, or any other type of computing device), a network device (e.g., a switch, a router, or any other type of networking device), a power supply device, or any other type of electronic device. The electronic device 100 is configured to be installed in a larger system, which comprises being received within a system chassis 182 of the larger system, as indicated by the dashed arrow in FIG. 1B, and being electrically coupled to the system. The system chassis 182 is indicated in FIG. 1B to aid understanding, but those having ordinary skill in the art would appreciate that the electronic device 100 can be provided on its own separate from the system chassis 182.

The chassis 110 can include one or more support structures such as walls, platforms, and other similar structures, that support and/or house various components of the electronic device 100. For example, the chassis 110 may comprise sheet metal walls that define a partially or fully enclosed housing. The chassis 110 may optionally include a receptacle 115 for removably receiving a pluggable electronic device, such as a network adapter (e.g., host bus adapter (HBA), network interface card (NIC)), optical connector, solid state drive, PCIe card, or other pluggable electronic device. The chassis 110 may house additional electronic components (in addition to the pluggable devices), such as, but not limited to, a processor, accelerator, controller, memory device, and/or other electronic circuitry.

The ejection mechanism 120 is coupled to the chassis 110. For example, in some cases the ejection mechanism 120 may be coupled to the same face of the chassis 120 as the one in which an access opening to the receptacle 115 is provided. The ejection mechanism 120 and/or the receptacle 115 may be provided on a portion of the chassis 110 that is accessible while the electronic device 100 is in an installed state in the system chassis 182. In some cases, the ejection mechanism 120 may be positioned so as to interfere with accessibility of the receptacle 115, such as by partially overlapping (blocking) the opening of the receptacle 115 or by being positioned relatively close thereto such that the ejection mechanism 120 otherwise interferes with a user's ability to install and remove a component from the receptacle 115.

The ejection mechanism 120 is one configuration of the ejection mechanism 20 described above, and as described above the ejection mechanism 120 can be selectively and reversibly reconfigured between two states: an ejection-enabled state (also referred to as a "first state") and an ejection-disabled state (also referred to as a "second state"). When in the ejection-enabled state, actuation of the ejection mechanism 120 causes ejection of the electronic device 100 from the system chassis 182, i.e., it causes movement of the electronic device 100 from an installed position within the system chassis 182 to an ejected position. In contrast, when in the ejection-disabled state, the ejection mechanism 120 can be actuated without causing such ejection of the electronic device 120, i.e., without causing movement of the electronic device 100 relative to the system chassis 182.

As shown in FIG. 1B, in some implementations the ejection mechanism 120 comprises an actuatable portion 130, an engagement portion 150, and a link 140. The actuatable portion 130 may be manually actuatable to impart forces and motion to the actuatable portion 130. For example, the actuatable portion 130 may comprise a lever arm, crank arm, push/pull element, or any other structure that is actuatable. The engagement portion 150 is configured to engage with the system chassis 182 such that actuation of the engagement portion 150 causes the electronic device 100 to move relative to the system chassis 182 (e.g., between the installed and ejected positions). The engagement portion 150 may be a cam, a gear, a worm drive, or any other structure that can engage the system chassis 182 to cause relative motion therebetween. The actuatable portion 130 is operably couplable to the engagement portion 150 by the link 140, depending on a state of the ejection mechanism 120, such that actuation of the actuatable portion 130 causes actuation of the engagement portion 150.

As noted above, the link 140 is configured such that it can operably couple the actuatable portion 130 to the engagement portion 150, depending on the state of the ejection mechanism 120. Specifically, in the ejection-enabled state the link 140 operably couples the actuatable portion 130 to the engagement portion 150, but in the ejection-disabled state the link 140 does not operably couple the actuatable portion 130 to the engagement portion 150. Thus, in the ejection-enabled state, actuation of the actuatable portion 130 causes actuation of the engagement portion 150 as described above and consequently ejection of the electronic device 100. In contrast, in the ejection-disabled state, actuation of actuatable portion 130 does not cause actuation of the engagement portion 150, and thus ejection of the electronic device does not occur.

In some implementations, the link 140 comprises a button, and the state of the ejection mechanism 120 is changed by moving the button. Specifically, in some implementations the button can be moved to a depressed position to decouple the actuatable portion 130 from the engagement portion 150, thus transitioning to the ejection-disabled state, or moved to an elevated position to couple the actuatable portion 130 to the engagement portion 150, thus transitioning to the ejection-enabled state.

Because the ejection mechanism 120 can be transitioned to the ejection-disabled state, in this state the ejection mechanism 120 can be moved out of the way of the receptacle 115 (or some other part which the ejection mechanism 120 may interfere) without causing ejection of the electronic device.

In the description above, the electronic device 110 is described as potentially including various electrical components, whether in the form of pluggable devices that are removably installed in a receptacle 115 or in the form of other electronic components that are more statically installed within the chassis 110. However, some electronic devices 100 may have a state in which no electronic components are installed therein. For example, some electronic devices 100 may have a state after manufacture of the chassis 110 and ejection mechanism 120 but prior to any electronics being installed therein. The present disclosure is applicable to electronic devices 100 in such a state in which the electronics have not yet been installed therein, and these electronic devices 100 may nevertheless be considered as "electronic" devices in this state by virtue of their being configured to receive electronic components installed therein.

Turning now to FIGS. 2-13, an electronic device 200 in accordance with various aspects of the disclosure will be described. The electronic device 200 is one configuration of the electronic devices 1 and 100, and thus some components of the electronic device 200 are similar to (e.g., specific configurations of) components of the electronic devices 1 and 100 described above. Similar components are referred to using the same last two digits, such as 220 and 120. The descriptions of components of the electronic device 1 and 100 are applicable to the similar components of the electronic device 200, and thus duplicative description of various aspects already described above may be omitted below. Although the electronic device 200 is one configuration of the electronic devices 1 and 100, the electronic device 1 and 100 and the components thereof are not limited to the electronic device 200 and the components thereof.

Various elements of the electronic device 200 or components thereof are illustrated in multiple figures. As elements are described below, one or a few figures which are thought to be particularly pertinent to the element being described will be noted, and thus the description below will not necessarily describe FIGS. 2-14 separately and in strict sequence but will instead move back and forth between various figures. In addition, it should be understood that when certain figures are referred to in relation to a particular element, figures other than those that are identified may also illustrate the same part from other perspectives.

Figure 2:
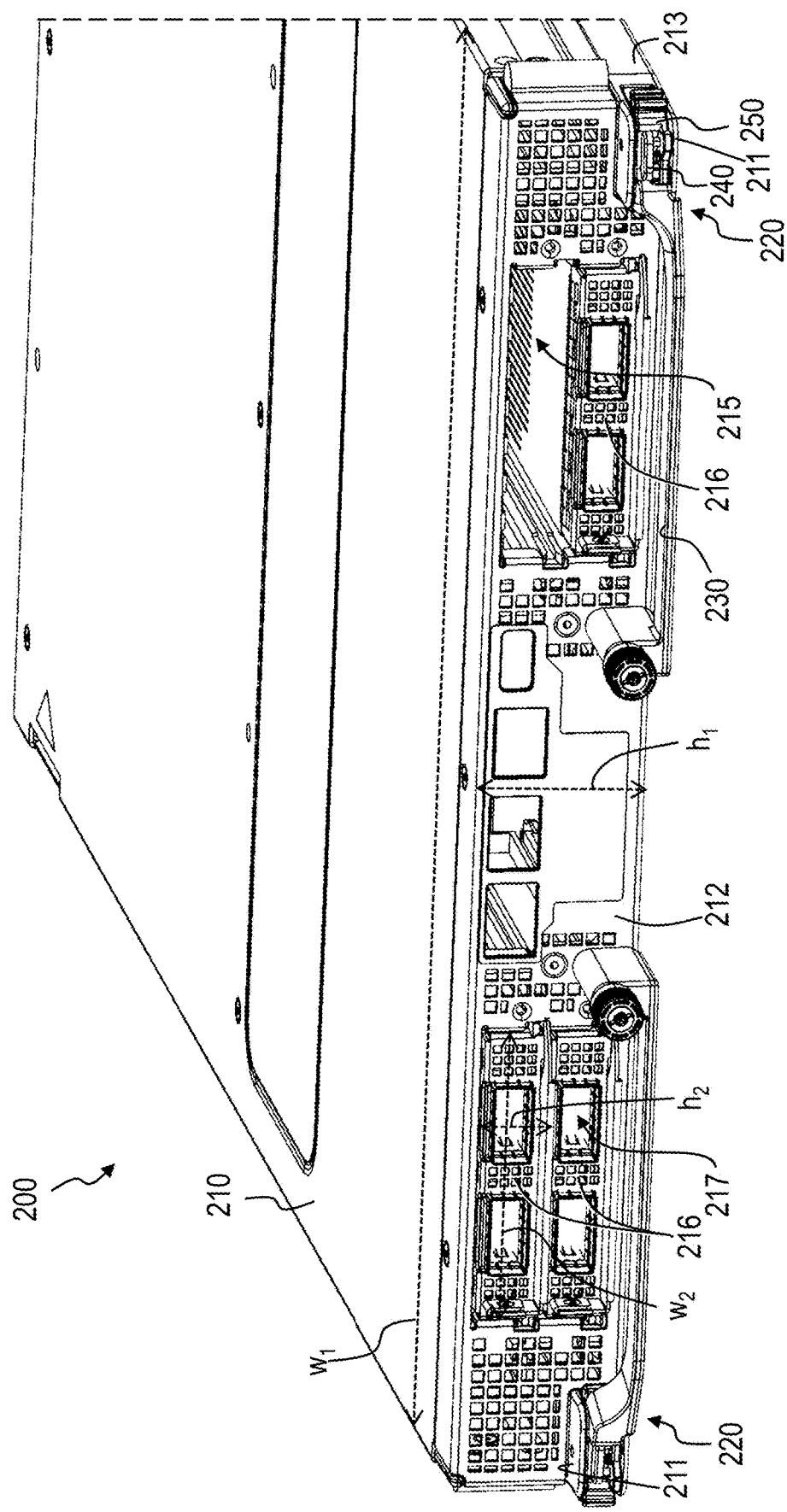
FIG. 2 is a perspective view of another electronic device comprising an ejection mechanism.

As shown in FIG. 2, the electronic device 200 comprises a chassis 210 and a number of ejection mechanisms 220 coupled to the chassis 210. The chassis 210 is configured to be removably received within a system chassis of a larger system to which the electronic device 200 may be coupled, such as the system chassis 382 illustrated in FIG. 14 and described in greater detail below. In FIG. 2 two ejection mechanisms 220 are illustrated for convenience, but any number equal to or greater than one could be provided. The ejection mechanisms 220 may be positioned on the chassis 210 so as to be able to engage the system chassis (e.g., system chassis 382) when the electronic device 200 is received therein. For example, in FIG. 2, the ejection mechanisms 220 are disposed on opposite sides of a face 212 of the chassis 210 near the side walls 213 of the chassis 210, which enables the ejection mechanisms 220 to engage portions of the system chassis that are adjacent to the side walls 213 when the chassis 210 is received within the system chassis. Moreover, when installed in the system chassis, the face 212 upon which the ejection mechanisms 220 are disposed may be exposed (as opposed to being covered by walls of the system chassis) so as to allow a user access to the ejection mechanisms 220 and other components on the face 212.

The chassis 210 also comprises a number of receptacles 215 configured to removably receive pluggable devices 216 respectively installed therein. In the implementation illustrated in FIG. 2 there are four receptacles 215, but in other implementations any number of receptacles 215 may be present. In FIG. 2, one receptacle 215 is shown in an empty state to allow visibility thereof, while the other three receptacles 215 (not labeled) are shown with pluggable devices 216 received therein. The receptacles 215 may also include electrical connectors (not illustrated), such as printed circuit board (PCB) edge finger connectors (also known as gold finger connectors in some cases) or other connectors, to electrically connect with pluggable devices 216 in an installed position within the receptacle 215. The receptacle 215 may also comprise rails, grooves, or other support/guide structures to guide the pluggable devices 216 into the receptacle and/or support the pluggable devices 216 when received in the receptacle 215.

Figure 3:
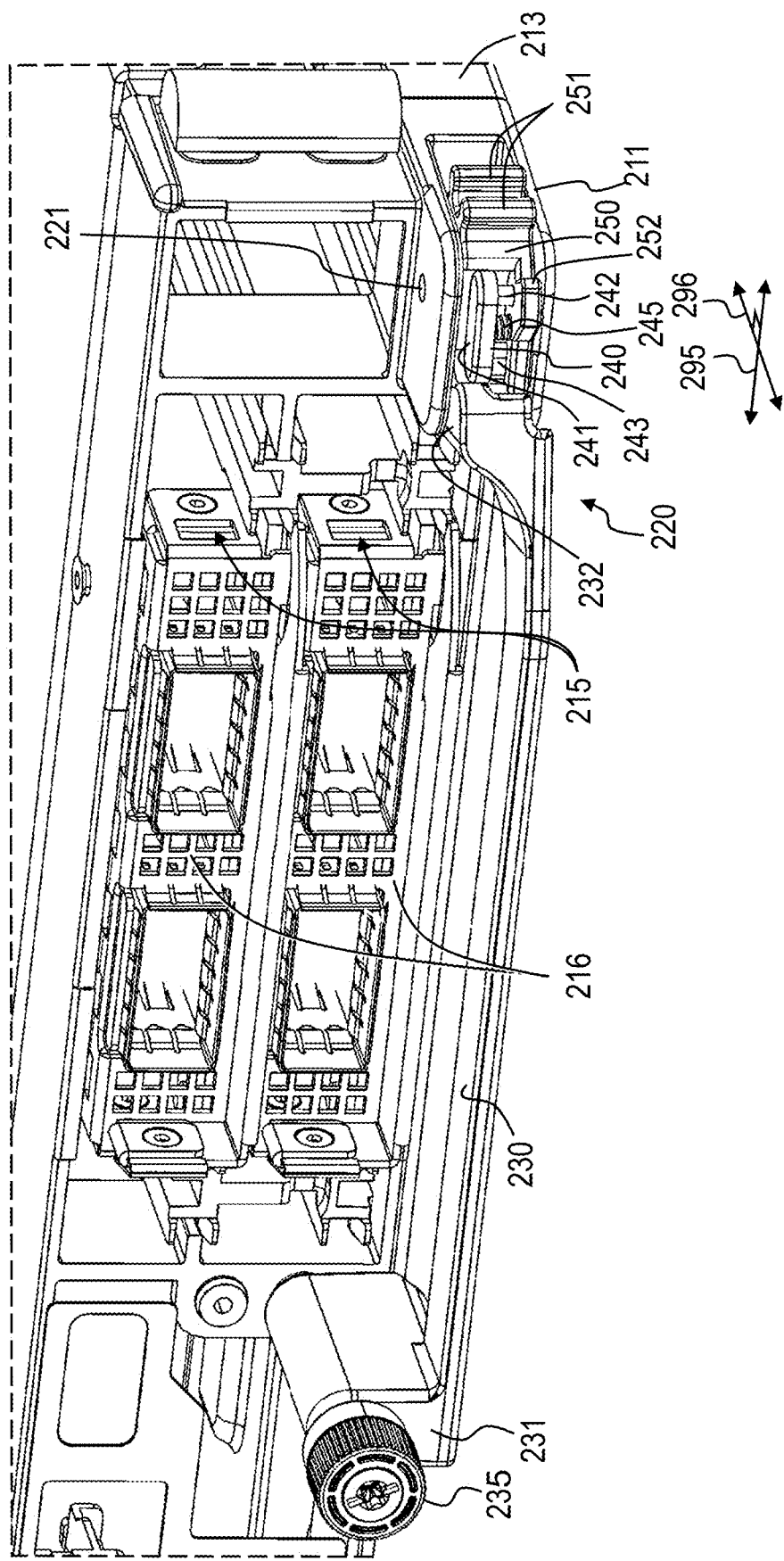
FIG. 3 is an enlarged perspective view of a portion of the electronic device of FIG. 2.

As shown in FIGS. 2 and 3, the chassis 210 also comprises brackets 211 protruding from the face 212 to couple the ejection mechanisms 220 to the chassis 210. In the implementation of FIGS. 2 and 3, there are two ejection mechanisms 220 and thus two brackets 211 are provided at two corners of the face 212 (e.g., a bottom left corner and a bottom right corner). The brackets 211 are coupled to and support the ejection mechanisms 220, as will be described in greater detail below.

Figure 4:
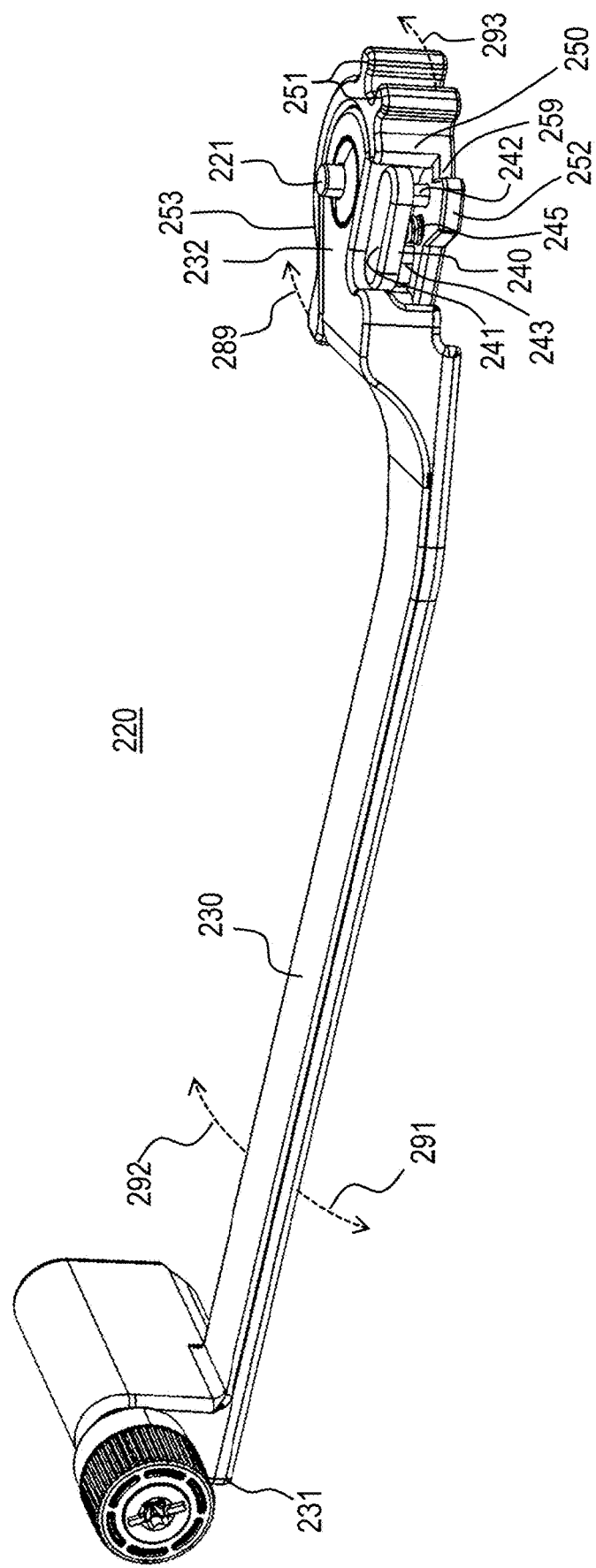
FIG. 4 is a perspective view of the ejection mechanism of the electronic device of FIG. 2.
Figure 5:
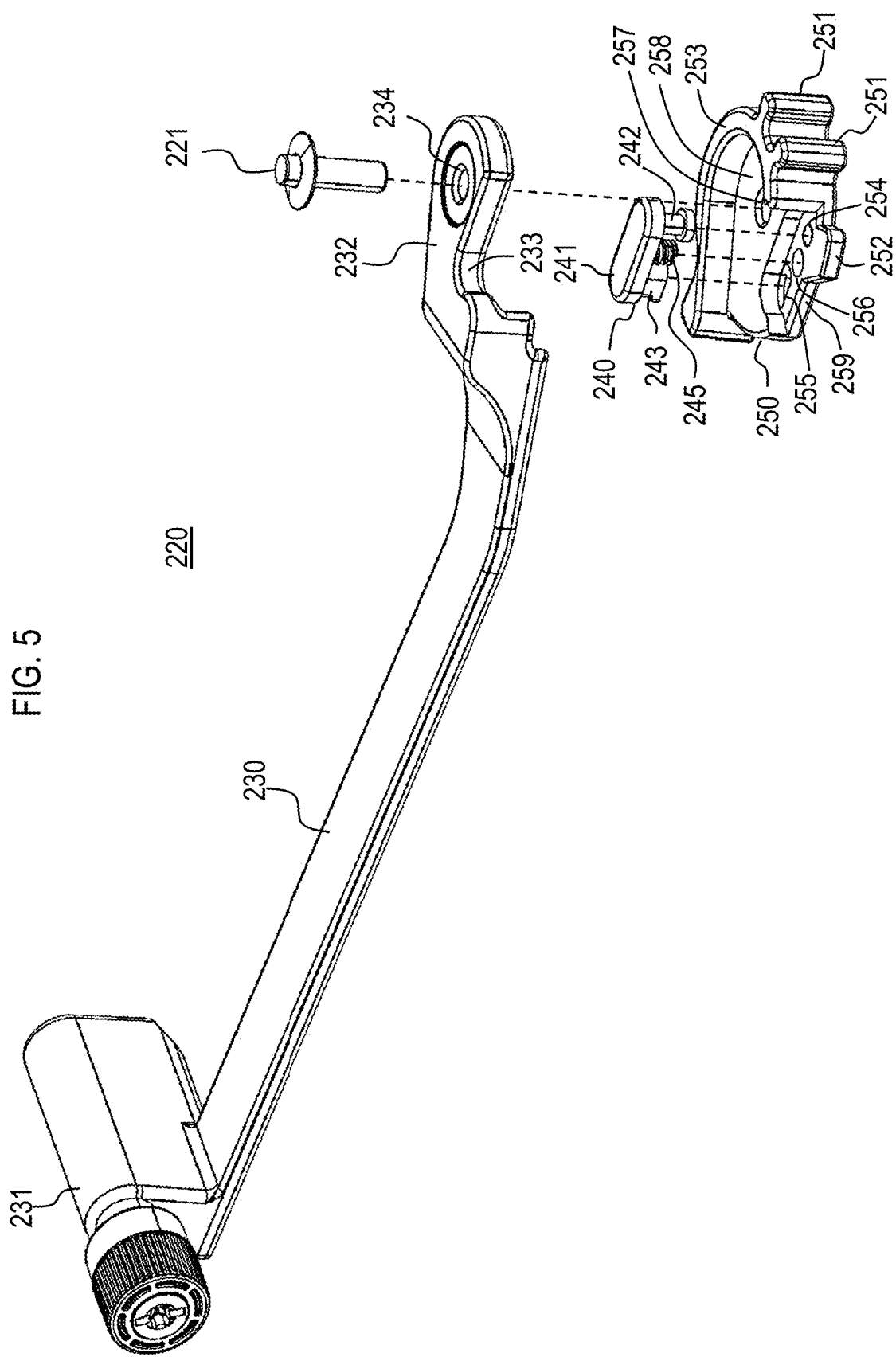
FIG. 5 is an exploded view of the ejection mechanism of FIG. 4.
Figure 10:
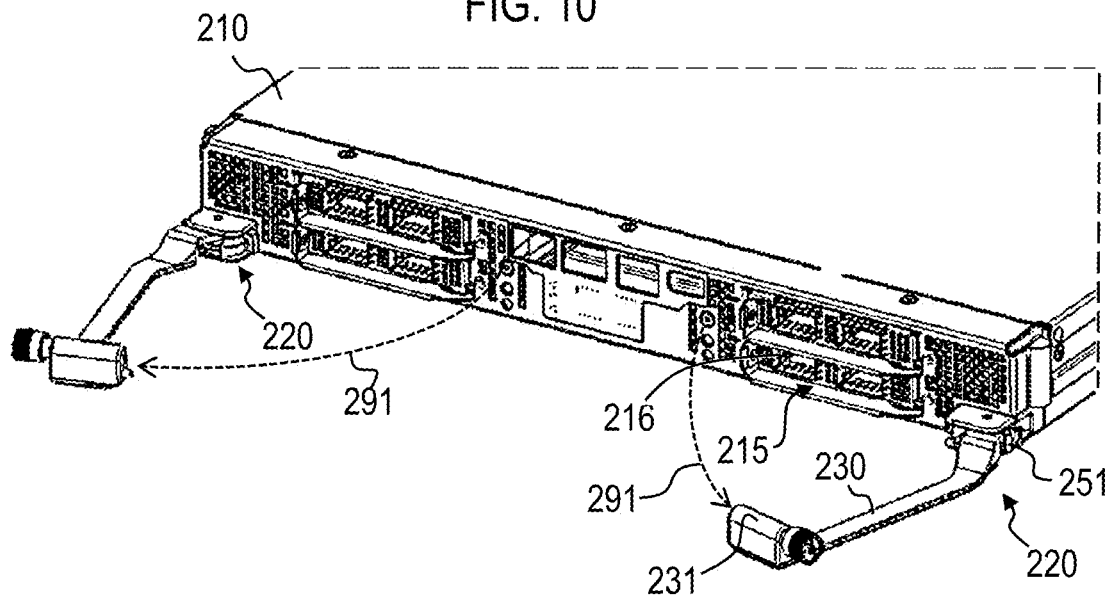
FIG. 10 is a perspective view of the electronic device of FIG. 2 illustrating a state in which the ejection mechanisms are at a second position and in the ejection-disabled state.
Figure 12:
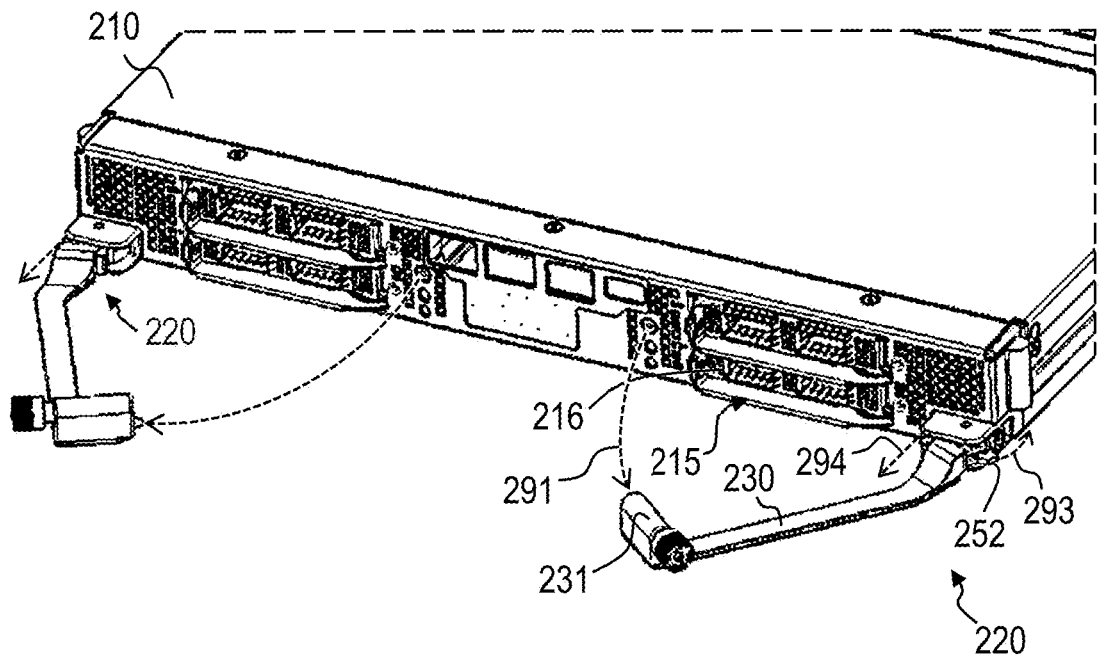
FIG. 12 is a perspective view of the electronic device of FIG. 2 illustrating a state in which the ejection mechanisms are at the second position and in the ejection-enabled state.

As shown in FIGS. 2, 3, 4 and 5, each ejection mechanism 220 comprises a lever arm 230, a cam 250, and a link 240 coupled to the cam 250. The lever arm 230 is one configuration of the actuatable portion 130 described above, the link 240 is one configuration of the link 140 described above, and the cam 250 is one configuration of the engagement portion 150 described above. As shown in FIG. 3, the lever arm 230 comprises an attached end portion 232 that is pivotably attached to the chassis 210 (via bracket 211) and a free end portion 231 opposite from the attached end portion 232. More specifically, as shown in FIG. 5 the attached end portion 232 comprises a hole 234, and as shown in FIGS. 3, 4 and 5 a pivot pin 221 extends through the hole 234. The pivot pin 221 also extends through holes in top and bottom portions of the bracket 211, thus pivotably coupling the lever arm 230 to the chassis 210, as shown in FIG. 3. The lever arm 230 can thus be actuated between at least two positions by moving the free end portion 231 along an arc away from or towards the face 212, which causes the lever arm 230 to pivot about the pivot pin 221. In a first position of the lever arm 230, the free end portion 231 of the lever arm 230 is adjacent to the face 212, such as is shown in FIGS. 2 and 3. The free end portion 231 may be releasably secured to the face 212 via a latching mechanism 235 (see FIG. 3), such as a thumb screw or other latching mechanism, that engages the face 212 so as to prevent inadvertent actuation of the lever arm 230, but when the latching mechanism 235 is unlatched the free end portion 231 is free to move relative to the face 212 and cause the lever arm 230 to pivot about the pivot pin 221 throughout a range of motion. In a second position of the lever arm 230, the free end portion 231 is spaced a distance apart from the face 212. FIGS. 10 and 12 illustrate the lever arm 230 in one example of the second position. The precise location of the second position may vary from one implementation to the next and is not limited to that shown in the figures. Motion of the lever arm 230 from the first position to the second position is referred to herein as actuation of the lever arm 230 in a first direction, which is indicated throughout various figures by arrows labeled 291 (see FIGS. 4 and 10). Motion of the lever arm 230 from the second position to the first position is referred to herein as actuation of the lever arm 230 in a second direction, which is indicated in various figures by arrows 292 (see FIG. 4).

Figure 6:
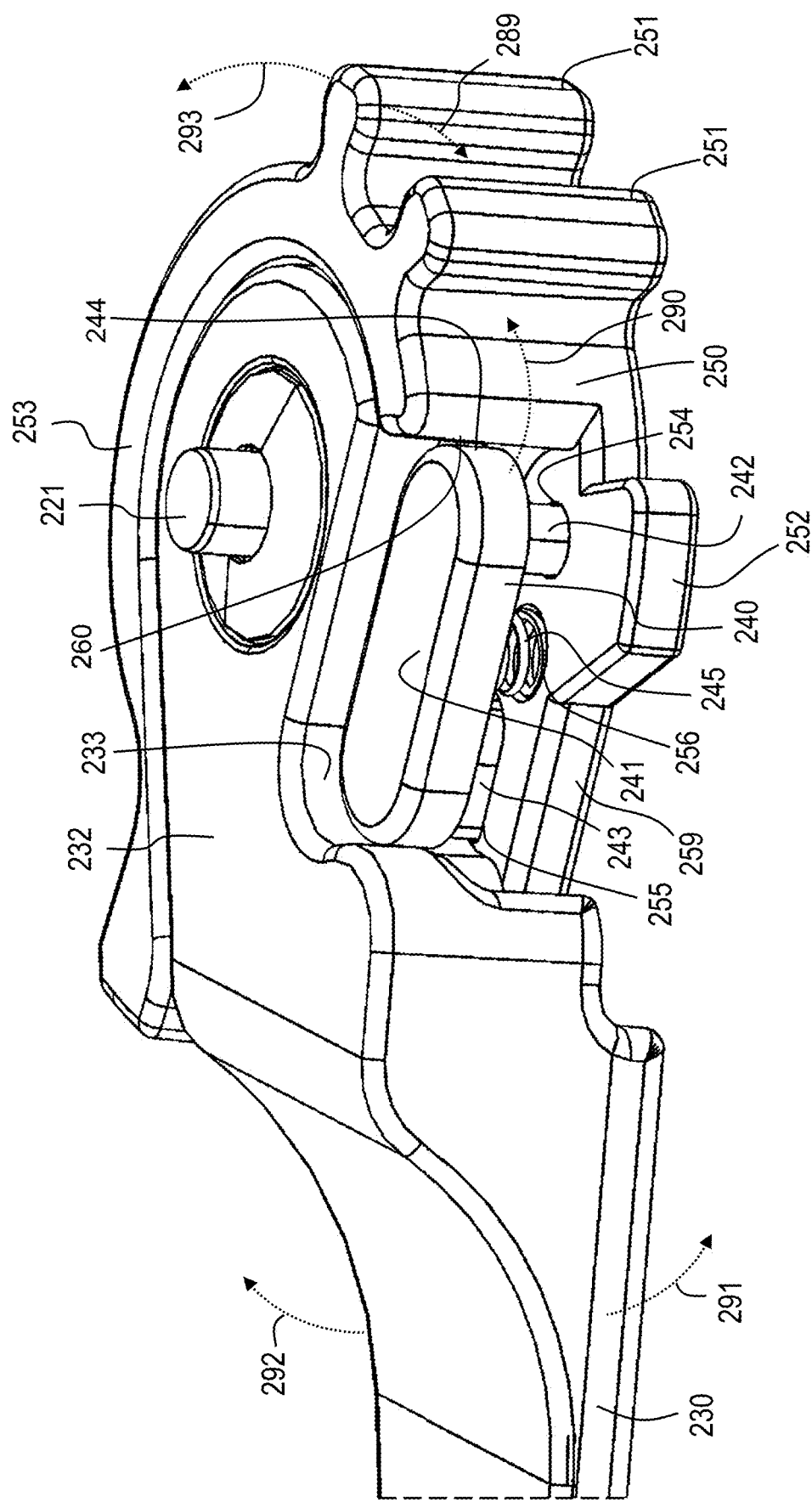
FIG. 6 is a perspective view of a portion of the ejection mechanism of FIG. 4.

Note that the first and second directions referenced herein are rotational directions (e.g., clockwise and counterclockwise) rather than linear directions, due to the pivoting nature of the lever arms 230 and other components. Thus, for example, the motions indicated by the arrows 291 and 293 in FIG. 6 are motions in the same direction (i.e., counterclockwise in the view of FIG. 6). In addition, because different ejection mechanisms 220 may have different orientations, the "first direction" for one ejection mechanism 220 may be different than the "first direction" of another ejection mechanism 220. Thus, references herein to directions that components of an ejection mechanism move should be understood relative to the ejection mechanism 220 in which those components are disposed. For example, in the electronic device 200 of FIG. 2, the "first direction" may be counterclockwise when considering the ejection mechanism 220 on the right side of the electronic device 200, but the "first direction" may be clockwise when considering the ejection mechanism 220 on the left side of the electronic device 200.

As shown in FIGS. 3, 4 and 5, the attached end portion 232 of the lever arm 230 is engaged with the cam 250. Specifically, as shown in FIG. 5, the cam 250 comprises a ridge 253 and a first shelf 258 recessed from the ridge 253, with the ridge 253 partially surrounding the first shelf 258 to define a region to receive the attached end portion 232 of the lever arm 230 as shown in FIGS. 4-6. More specifically, as shown in FIGS. 4-6, the attached end portion 232 of the lever arm 230 rests on the first shelf 258 with the ridge 253 adjacent to and partially surrounding the attached end portion 232. The ridge 253 may engage with the lever arm 230 to transfer motion of the lever arm 230 to the cam 250, as explained in greater detail below, and thus may be an example of a lever arm engagement feature referred to herein.

As shown in FIG. 5, the first shelf 258 of the cam 250 also has a hole 257, and the pivot pin 221 extends through this hole 257. Thus, the pivot pin 221 pivotably couples not only the lever arm 230, but also the cam 250, to the bracket 211. As shown in FIGS. 3-9, the cam 250 also comprises teeth 251 and 252, which extend radially from the cam 250. As illustrated, the teeth 251 and 252 extend in a direction generally away from the direction of the free end portion 231 of the lever arm 230 when in the first, latched position of the lever arm 230. The teeth 251 and 252 are arranged to engage with lateral walls of the system chassis which are disposed adjacent to the lateral walls 213 (see FIG. 2) of the chassis 210 when the electronic device 200 is installed in the system chassis. The teeth 251 and 252 convert pivoting motion of the cam 250 into translational motion of the electronic device 200 relative to the system chassis, with the direction of translation of the electronic device 200 depending on the direction of pivoting of the cam 250. If the cam 250 pivots in the first direction (i.e., the direction indicated by arrows 293 in FIGS. 4, 6 and 13), then the teeth 251 and 252 convert this motion into translation of the electronic device 200 in a direction towards an ejected position (i.e., the direction indicated by arrow 294 in FIG. 13). If instead the cam 250 pivots in the second direction (i.e., a direction indicated by the arrows 289 in FIG. 4), then this will cause translation of the electronic device 200 towards an installed position in the system chassis (i.e., a direction opposite that indicated by the arrow 294 in FIG. 13). Thus, actuation of the cam 250 controls whether the electronic device 200 is ejected (i.e., moved to the ejected position) or installed (i.e., moved to the installed position) within the system chassis, depending on a direction that the cam 250 is actuated. The actuation of the cam 250 is controlled by actuation of the lever arm 230, and also by a state of the link 240 in some circumstances, as described in greater detail below.

The teeth 251 and 252 may engage the system chassis at different stages of motion or positions of the cam 250. For example, the teeth 251 may protrude laterally beyond the side wall 213 and engage the system chassis when the cam 250 is in the position shown in FIG. 3, which corresponds to the first position of the lever arm 230, but in this position the tooth 252 might not engage with the system chassis. However, as the cam 250 is rotated from the position shown in FIG. 3 in the first direction, the tooth 252 eventually engages with the system chassis 252. For example, when the cam 250 is at the position illustrated in FIG. 14, the tooth 252 may engage the system chassis. For example, the teeth 251 and 252 may engage with an opening or recess in the system chassis.

Motion of the cam 250 in the second direction (indicated by arrow 289 in FIGS. 4 and 6) is caused by motion of the lever arm 230 in the second direction (indicated by arrow 292 in FIGS. 4 and 6). As shown in FIG. 4-6, the ridge 253 abuts one side of the attached end portion 232. As a result, when the lever arm 230 is pivoted in the second direction towards the face 212 (the second direction being indicated by arrow 292 in FIGS. 4 and 6), the lever arm 230 (eventually) comes into contact with the ridge 253 and thus continued motion of the lever arm 230 thereafter can cause the cam 250 to pivot in the same direction as the lever arm 230. In other words, when the lever arm is actuated in the second direction towards the face 212 (arrow 292 in FIGS. 4 and 6), the cam 250 is also actuated in the same direction (indicated by arrow 289 in FIGS. 4 and 6). As noted above, this motion of the cam 250, when engaged with the system chassis (e.g., 382 in FIG. 14), can cause translation of the electronic device 200 towards the installed position in the system chassis.

In contrast, motion of the cam 250 in the first direction (indicated by arrows 293 in FIGS. 4 and 6) is dependent on both actuation of lever arm 230 in the first direction (indicated by arrows 291 in FIGS. 4 and 6) and a state of the link 240. In a first state of the link 240 (an ejection-enabled state), actuation of the lever arm 230 in the first direction (arrows 291) causes actuation of the cam 250 in the first direction (arrows 293), and consequently ejection of the electronic device 200. In a second state (an ejection-disabled state), actuation of the lever arm 230 in the first direction does not cause any actuation of the cam 250, and thus ejection of the electronic device 200 does not occur despite the actuation of the lever arm 230 in the first direction (arrows 291). Note that the ejection-enabled and ejection-disabled states of the link 240 correspond to the ejection-enabled and ejection-disabled states, respectively, of the ejection mechanism 220. The link 240 and its interactions with the cam 250 and the lever arm 230 will be described in greater detail below.

Figure 8:
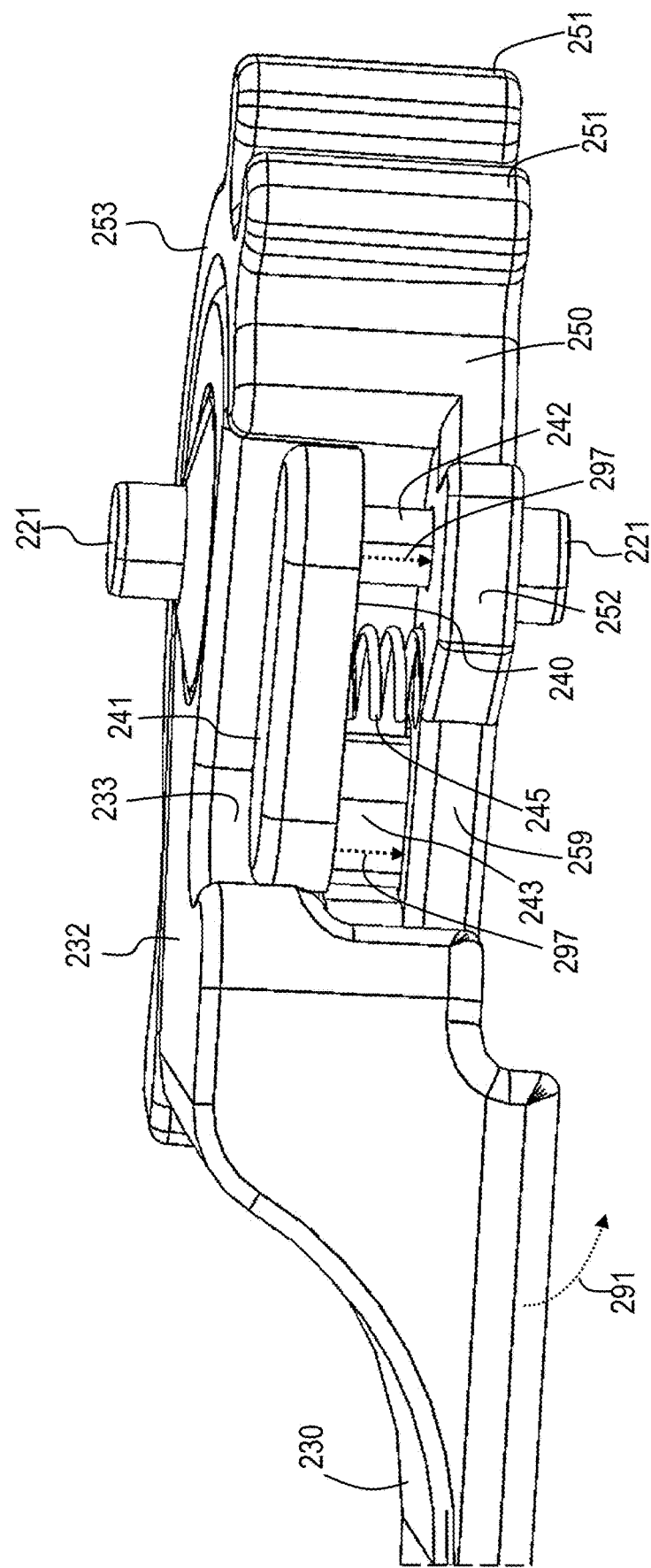
FIG. 8 is a perspective view of the portion of the ejection mechanism of FIG. 4 with a link thereof in an elevated state of the link and an ejection-enabled state of the ejection mechanism.

As shown in FIGS. 5, 6, and 8 the link 240 comprises a button 241 and two engagement features 242 and 243 that extend in a direction generally parallel to the direction in which the button 241 is to be pressed (e.g., a direction parallel to the dashed lines in FIG. 5). In some embodiments, this direction is also generally parallel to the height dimension $h_1$ of the electronic device 200 illustrated in FIG. 2. As shown in FIGS. 5 and 6, the cam 250 comprises a second shelf 259 recessed from the first shelf 258, and the second shelf 259 comprises apertures 254 and 255 which receive the engagement features 242 and 243, respectively. The fit between the engagement features 242 and 243 and the apertures 254 and 255 allows translation of the engagement features 242 and 243 (i.e., translation along the longitudinal axes of the engagement features 242 and 243) through the apertures 254 and 255 within a limited range of motion while also substantially preventing motion of the link 240 relative to the cam 250 in other directions. Thus, the link 240 and the cam 250 are constrained to move together in most directions except that the link 240 can translate relative to the cam 250 within a limited range in a direction generally parallel to the pivot pin 221.

Figure 7:
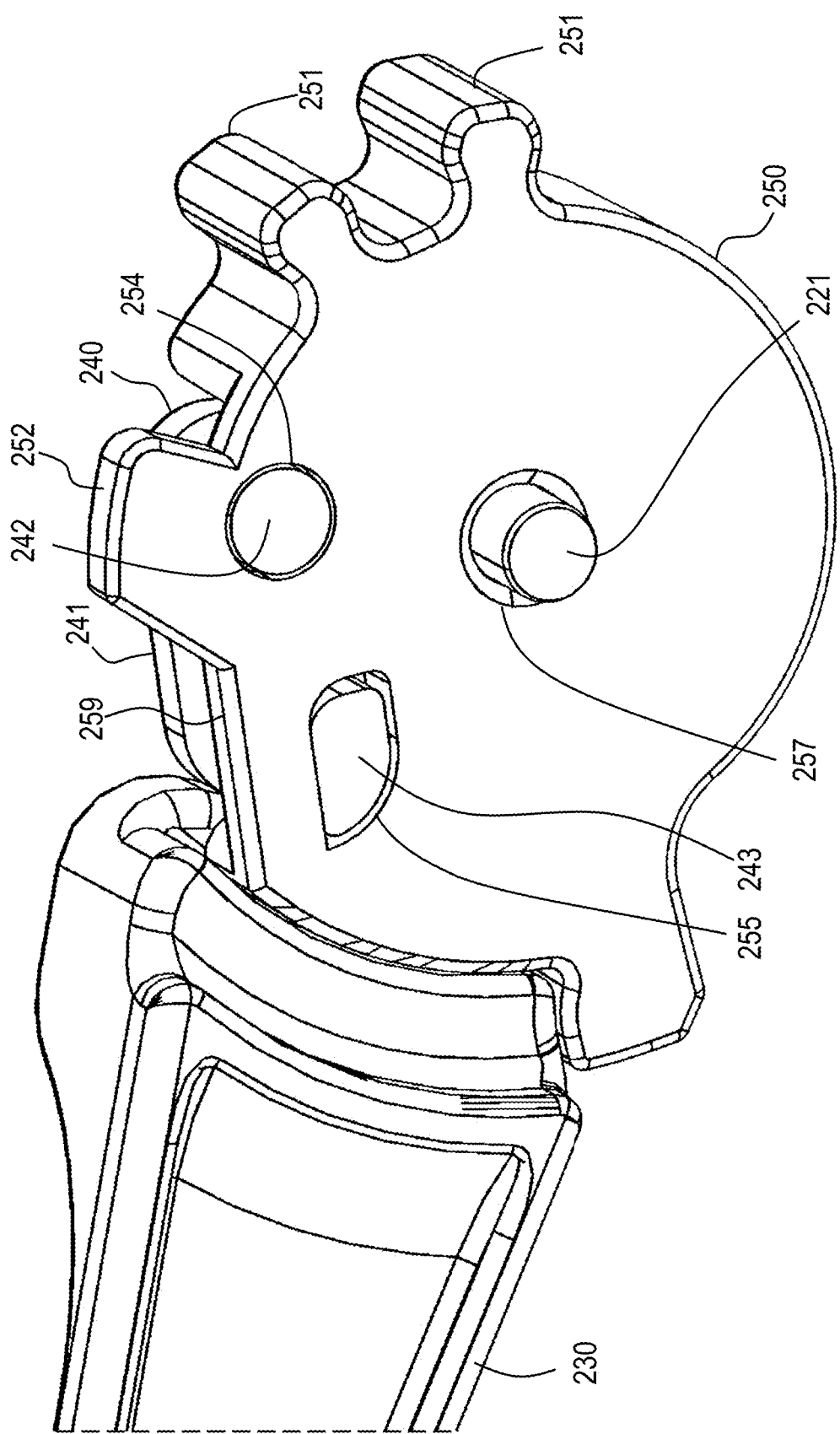
FIG. 7 is another perspective view of the portion of the ejection mechanism of FIG. 4.
Figure 9:
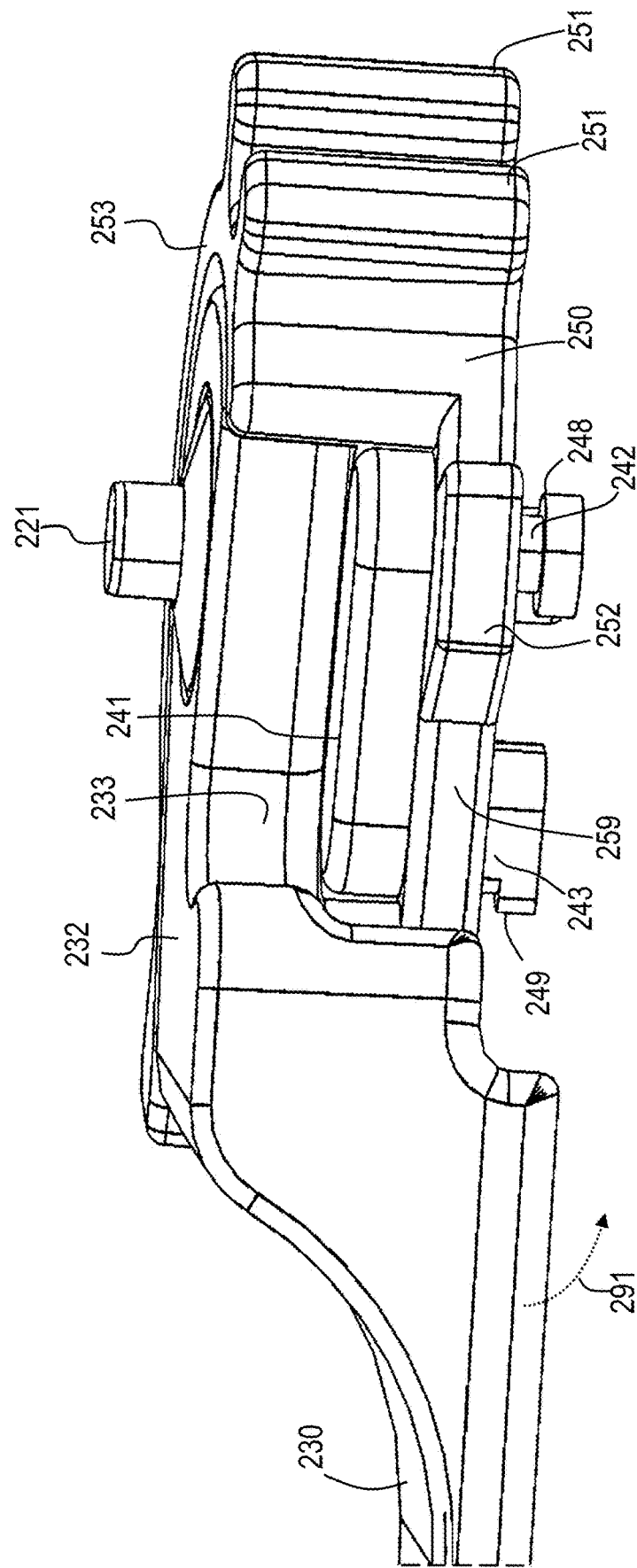
FIG. 9 is a perspective view of the end portion of the ejection mechanism of FIG. 4 with a link thereof in a depressed state of the link and an ejection-disabled state of the ejection mechanism.

The apertures 254 and 255 may extend through the thickness of the cam 250, as shown in FIG. 7, thus allowing the engagement features 242 and 243 to move downward beyond a bottom surface of the cam 250 in certain states, as shown in FIG. 9. The button 241 may prevent the link 240 from moving downward beyond a certain position (e.g., the position at which the button 241 contacts the second shelf 259, as illustrated in FIG. 9). In addition, the engagement features 242 and 243 may also comprise retention features 248 and 249 such as flanges (see FIG. 9), respectively, that prevent the engagement features 242 and 243 from moving upward beyond a certain position (e.g., the position at which the retention features 248 and 249 engage with the second shelf 259). Thus, the button 241 and the retention features 248 and 249 set lower and upper limits of the range of motion of the link 240 relative to the cam 250. The button 241 and the retention features 248, 249 also serve to retain the engagement features 242 and 243 within the apertures 254 and 255, and hence secure the link 240 to the cam 250. Although two engagement features 242 and 243 are illustrated, any number of engagement features equal to or greater than one may be provided. Similarly, any number of retention features may be provided, and not necessarily every engagement feature is necessarily provided with a retention feature.

As shown in FIG. 5, a spring 245 is disposed within a recess 256 in the second shelf 259, with the spring 245 engaging a bottom surface of the button 241 and biasing the link 240 toward a position in which the button 241 is raised above the second shelf 259 illustrated in FIG. 8 (i.e., in the direction indicated by the arrows 297). Thus, a neutral or resting position of the link 240 may be the raised position in which the button 241 is elevated above the second shelf 259 (e.g., at an first limit of travel of the link 240), such as the position illustrated in FIGS. 3, 4, 6, and 8. Moreover, the button 241 can be pressed so as to move toward the shelf 259 (along the direction indicated by the arrows 297 in FIG. 8) away from the raised position toward a depressed position in which the button 241 is adjacent to (in some cases, touching) the second shelf 259 (e.g., a second limit of travel of the link 240), as illustrated in FIG. 9. The button 241 may be moved to the depressed position by a user manually pressing against a top surface of the button 241 in the direction indicated by the arrows 297 in FIG. 8 to apply a force sufficiently strong to overcome the biasing force of the spring 245. When the user ceases to press the button 241, the spring 245 may return the button to the raised position unless prevented from doing so by something else (such as the lever arm 230, as described below). The button 241 may be arranged such that it can be pressed by user when the lever arm 230 is in the first position.

As noted above the link 240 has two states, and these two states correspond to the raised and depressed positions of the button 241 described above. Specifically, the ejection-enabled state corresponds to the raised position of the button 241 and the ejection-disabled state corresponds to the depressed position of the button 241.

Figure 13:
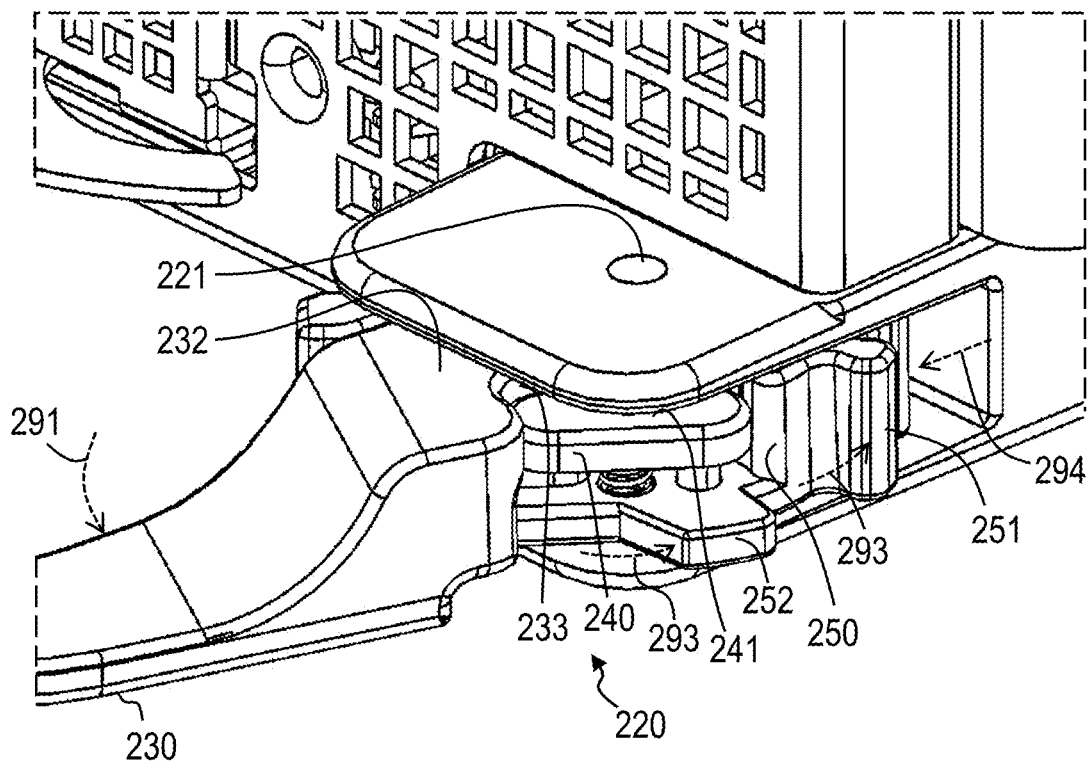
FIG. 13 is an enlarged perspective view of a portion of the electronic device of FIG. 12.

FIGS. 12 and 13 illustrate a state in which the lever arm 230 has been actuated in the first direction from the first position to the second position with the link 240 in the ejection-enabled state (i.e., the raised position of button 241). As shown in FIGS. 6, 8 and 13, when the link 240 is in the ejection-enabled state, the button 241 is positioned adjacent to a surface 233 of the attached end portion 232 of the lever arm 230 such that when the lever arm 230 is moved in a first direction away from the face 212 (indicated by arrows 291 in FIGS. 4, 6, 8-13) the surface 233 collides with the button 241. In other words, the button 241 interferes with the surface 233 when the lever arm 230 is actuated in the first direction. As a result of the contact between the surface 233 and the button 241, the motion of the lever arm 230 in the first direction (arrow 291) causes the button 241 to also move in the same direction (indicated by arrow 290 in FIG. 6) along with the lever arm 230. Moreover, one or more surfaces or features of the link 240 interfere with one more surfaces or features of the cam 250 such that the motion of the link 240 in the first direction (arrow 290) causes the cam 250 to also move in the first direction (indicated by arrow 293 in FIGS. 6 and 13). For example, as noted above, the link 240 is coupled to the cam 250 via the engagement features 242 and 243, and thus in some implementations interference between these engagement features 242 and 243 and the cam 250 causes (or contributes to) the transferring of the motion of the button 241 to the cam 250. As another example, in some implementations a surface 244 of the button 241 interferes with a surface 260 of the cam 250, as shown in FIG. 6, and contact between these surfaces 244 and 260 may thus cause (or contribute to) the transferring of the motion of the button 241 to the cam 250. It should be understood that other surfaces or features of the link 240 could interfere with other surfaces or features of the cam 250, in addition to or in lieu of those noted above, to drive motion of the cam 250 and also that multiple features of the link 240 may simultaneously contribute to the motion of the cam 250. Thus, the link 240 transfers the actuation of the lever arm 230 in the first direction (arrow 291) into actuation of the cam 250 in the first direction (arrow 293) in the ejection-enabled state of the link 240. For example, as can be seen in FIG. 13 because the link 240 is in the ejection-enabled state, the actuation of the lever arm 230 in the first direction 291, caused the cam 250 to rotate in the first direction (indicated by arrows 293) along with the lever arm 230. This rotation of the cam 250 in the first direction, when engaged with the system chassis, causes motion of the electronic device 200 in the direction indicated by the arrow 294 (FIGS. 12 and 13), resulting in ejection of the electronic device 200 from the system chassis as described above.

Figure 11:
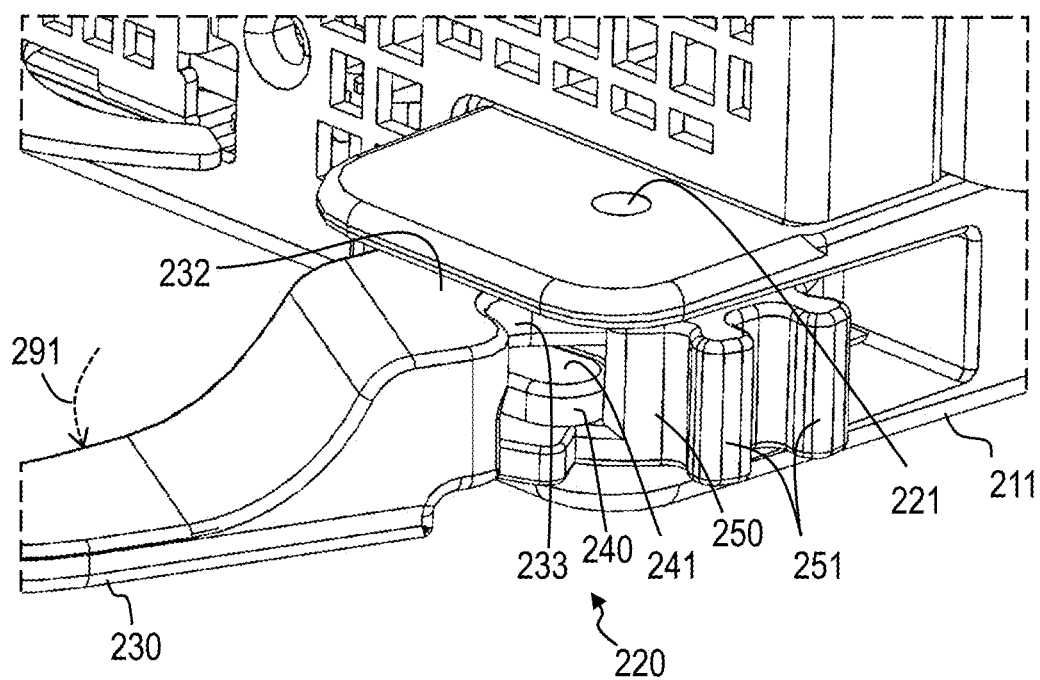
FIG. 11 is an enlarged perspective view of a portion of the electronic device of FIG. 10.

In contrast, FIGS. 10 and 11 illustrate a state in which the lever arm 230 has been actuated in the first direction (indicated by arrows 291) from the first position to the second position but with the link 240 in the ejection-disabled state (i.e., the depressed position of the button 241). As shown in FIGS. 9 and 11, when the button 241 is in the depressed position, the button 241 is positioned below the attached end portion 232 of the lever arm 230. Thus, as shown in FIG. 11, when the lever arm 230 is moved in the first direction (indicated by arrow 291), the attached end portion 232 of the lever arm 230 is able to pass freely over the button 241. Accordingly, there is no contact between the surface 233 and the button 241 and the motion of the lever arm 230 does not directly cause motion of the button 241 or the cam 250 coupled thereto. In addition, in some implementations, to ensure that the cam 250 does not move in the ejection-disabled state (e.g., due to friction forces from the moving lever arm 230, inadvertent contact from a user, or other possible sources of motion), one or more features of the link 240 may engage with the bracket 211 when the button 241 is in the depressed state, and this engagement may lock the link 240, and hence also the cam 250, in place relative to the bracket 211. For example, in some implementations, when the button 241 is in the depressed state, as shown in FIG. 9, the engagement features 242 and 243 of the link 240 extend downward below a bottom surface of the cam 250. As shown in FIG. 11, part of the bracket 211 is positioned below and adjacent to the bottom surface of the cam 250, and thus when the engagement features 242 and 243 are extended below the bottom surface of the cam 250 in the depressed state of the button 241 they engage with the bracket 211, for example by being received within corresponding recesses or apertures (not illustrated) in the bracket 211. (In contrast, in the released state of the button 241, i.e., the ejection-enabled state, the engagement features 242 and 243 are withdrawn, as shown in FIGS. 7 and 8, and thus do not engage bracket 211.) The engagement between the engagement features 242 and 243 and the bracket 211 may hold the cam 250 substantially stationary relative to the chassis 210. For example, as can be seen in FIG. 11, the cam 250 remains stationary in its resting position despite the actuation of the lever arm 230 in the first direction as a result of the button 241 being in the depressed position. Because the cam 250 remains stationary, ejection of the electronic device 200 does not occur despite the actuation of the lever arm 230 in the first direction 291.

Once the lever arm 230 has been moved at least partially over the button 241 in the depressed position, such as is shown in FIG. 11, the lever arm 230 may hold the button 241 in the depressed position even if a user ceases to press the button 241 down. Upon the lever arm 230 being returned to the first position, the lever arm 230 may cease to hold the button 241 down and the button 241 may be free to return to the elevated position due to the urging of the spring 245. In other implementations, the button 241 may be pressed once to move it to the depressed position and pressed again to release the button from the depressed position.

Although the link 240 is illustrated as comprising a button 241, in some implementations, instead of the button 241 the link 240 may comprise other types of members that can be moved between two states so as to operably couple or not operably couple the lever arm 230 to the cam 250. For example, the link 240 may comprise any mechanism that can be moved between one position in which it interferes with the lever arm 230 and is coupled to the cam 250, thus coupling the lever arm 215 to the cam 250, and another position in which the mechanism is out of the path of (i.e., no longer interferes with) the lever arm 230, thus decoupling the lever arm 230 from the cam 250.

In some implementations, the electronic device 200 has dimensions that allow it to fit within one standard rack unit (1U) as defined in the specification EIA-310 by the Electronic Industries Alliance. In other words, in implementations in which the electronic device 200 fits within 1U, the height $h_1$ of the electronic device 200 (see FIG. 2) is less than or equal to 1.75 inches (44.45 mm). In some implementations in which the electronic device 200 fits within 1U, the width $w_1$ of the electronic device 200 (see FIG. 2) is less than or equal to 19 inches (482.6 mm), while in some implementations the width $w_1$ is less than or equal to 23 inches (584.2 mm).

For example, in some implementations, the electronic device 200 comprises a 1U input-output module (IOM) of a data storage system and the pluggable devices 216 comprise network adaptors (e.g., HBAs, NICs) for the data storage system, which may include, for example, Fiber Channel adapters, Ethernet based adapters, Non-Volatile Memory Express Over Fabric adapters, and similar HBAs/NICs. In some implementations, the pluggable devices 216 are compliant with the open compute project (OCP) NIC 3.0 specification. The OCP NIC 3.0 standard includes multiple form factors, including a Small Form Factor (SFF), and in some implementations, the pluggable devices 216 comply with the OCP NIC 3.0 SFF. Such OCP NIC 3.0 SFF compliant pluggable devices 216 have a width dimension $w_2$ equal to 76 mm and a height dimension $h_2$ equal to 11.5 mm (see FIG. 2). In other implementations, the pluggable devices 216 may comply with other form factors of the OCP NIC 3.0 specification, in still other implementations the pluggable devices 216 may comply with other industry standards, and in still other implementations the pluggable device 216 need not necessarily comply with any formal standard.

In some implementations, four such pluggable devices 216 compliant with the OCP NIC 3.0 SFF are provided within a 1U-sized electronic device 200 on a face thereof, as illustrated in FIG. 2, and in view of the aforementioned dimensions of such pluggable devices 216 it can be difficult to arrange the pluggable devices 216 within the area on this 1U face while still leaving room for other components that may be needed. Thus, as shown in FIG. 2, in some implementations two groups of receptacles 215 are provided with each group having two receptacles 215 stacked vertically atop one another, which arrangement allows all four receptacles 215 to fit on the face 212 while also leaving room on the face for other components. However, one difficulty with this stacked configuration of the receptacles 215 is that it leaves very little free space in the height dimension above, below, or between the stacked receptacles 215 in which the ejection mechanisms 220 can be disposed. As a result, the ejection mechanism 220 may end up being disposed at a location where it will interfere with access to one of the receptacles 215, such as a position partially covering a receptacle 215 or a position that is relatively close to a receptacle 215. For example, as shown in FIG. 2, in some implementations the ejection mechanism 220 is disposed immediately adjacent to the bottom edge of the lower-most receptacles 215. In this position, the ejection mechanisms 220 do not directly cover the bottom receptacles 215, but nevertheless the ejection mechanisms 220 are sufficiently close to the bottom edge of the receptacles 215 that the ejection mechanisms 220 can interfere with (e.g., make more difficult) the installation or removal of pluggable devices 216 in or from the receptacles 215. For example, the ejection mechanisms 220 may be so close to the bottom edge of the receptacle 215 that the pluggable devices 216 may scrape against the ejection mechanisms 220 during installation and removal, which may damage the pluggable devices 216. As another example, the ejection mechanism 220 may block the hand of a user attempting to grasp the pluggable device 216 and thus hinder and possibly prevent the pluggable device 216 from being removed. As another example, the pluggable devices 216 may themselves contain receptacles 217 (see FIG. 2) in which still other pluggable devices or connectors may be received, and the ejection mechanism 220 may prevent or make it more difficult to grasp these other pluggable devices/connectors that are plugged into the pluggable devices 216. However, by placing the ejection mechanism 220 in the ejection-disabled state as described above (by depressing the link 240), the lever arms 230 can easily be moved out of the way of the receptacles 215 by actuating the lever arms 230 in the first direction, thus allowing access to the receptacles 215 and/or the pluggable devices 216 received therein without causing ejection of the electronic device 200.

In some examples (not illustrated) the lever arm 230 at least partially overlaps one of the receptacles 215. In some examples, the lever arm 230 does not overlap a receptacle 215 but is positioned relatively close to a receptacle and thus may interfere with accessing the receptacle 215 or a device installed therein, such as positioned 2.0 mm or less from the nearest receptacle 215 in some examples, 1.5 mm or less in some other examples, and 1.2 mm or less in still other examples. In other words, a gap or vertical spacing between the lever arm 230 and the closest horizontal edge of the closest receptacle 215 to the lever arm 230 is 2.0 mm or less in some examples, 1.5 mm or less in some other examples, and 1.2 mm or less in some other examples.

Although an implementation of the electronic device 200 is described above in which the electronic device is an IOM comprising four receptacles 215 to receive pluggable devices 216 in the form of OCP NIC 3.0 SFF compliant devices, it should be understood that this example is not limiting. The electronic device 200 could be configured as any electronic device with any number of receptacles 215 configured to receive any type of pluggable device 216. In other words, the ejection mechanisms 220 can be used with a variety of configurations of the chassis 210 including but not limited to that illustrated in FIG. 2.

Figure 14:
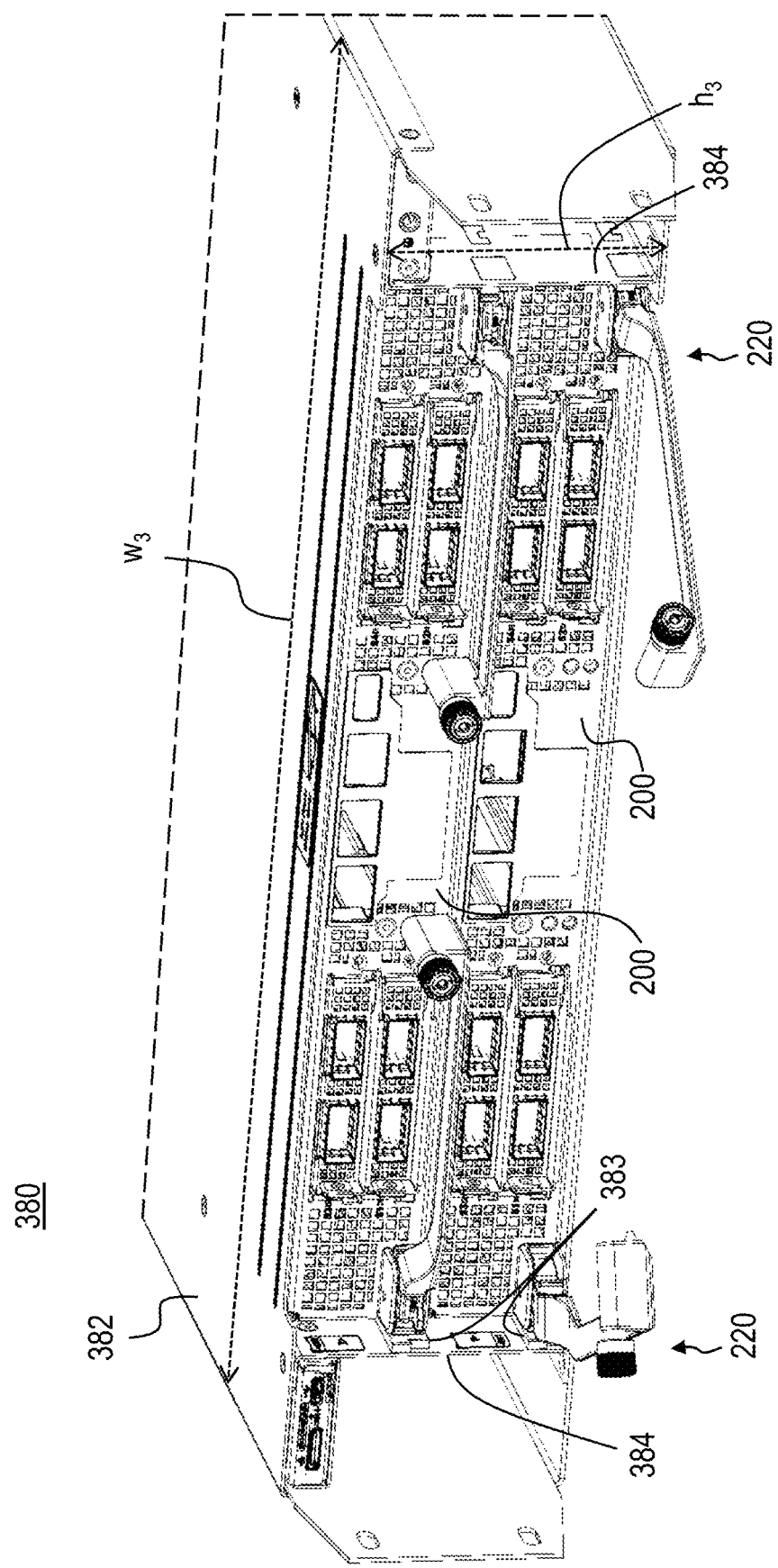
FIG. 14 is a perspective view of a system housing the electronic device of FIG. 2.

Turning now to FIG. 14, a system 380 is described. The system 380 comprises a system chassis 382 configured to removably receive one or more electronic devices, such as the electronic devices 200 described above. In FIG. 14, the system chassis 382 is illustrated receiving two electronic devices in the form of electronic devices 200, but in other implementations more or fewer electronic devices may be received in the system chassis 382. Moreover, the system chassis 382 may comprise or be configured to receive other electronic devices, in addition to the electronic devices 200. The system chassis 382 may also comprise electrical connectors arranged to electrically connect with the electronic devices 200 when the electronic devices 200 are in an installed position within the system chassis 382 (e.g., the position of the electronic devices 200 illustrated in FIG. 14).

As shown in FIG. 14, the system chassis 382 also comprises engagement mechanisms 383. The engagement mechanisms 383 are disposed in lateral walls 384 of the system chassis 382, with the lateral walls 384 being positioned adjacent to the lateral walls of the electronic devices 200 when the electronic devices 200 are in the installed position. The engagement mechanisms 383 are located so as to be adjacent to the ejection mechanisms 220 of the electronic devices when the electronic devices 200 are in the installed position. Only the two engagement mechanisms 383 on the left side of the system chassis 382 are visible in FIG. 14, but two additional engagement mechanisms 383 may similarly be provided on the right side of the system chassis 382. The engagement mechanisms 383 may comprise one or more structures or features configured to engage with the teeth 251 and 252 of the ejection mechanism 220. For example, the engagement mechanisms 383 may comprise flanges, ridges, recesses, or other surfaces arranged to engage with the teeth 251 and 252. Thus, when the ejection mechanisms 220 are actuated, the ejection mechanisms 220 can interact with the engagement mechanisms 383 to drive motion of the electronic devices 200 relative to the system chassis 382. Specifically, the ejection mechanisms 220 can be actuated in a first direction when in an ejection-enabled state to cause electronic devices 200 in the installed position shown in FIG. 14 to be moved to an ejected position (not illustrated), with the electronic devices 200 being electrically disconnected from the system 380 in the ejected position. (When the ejection mechanisms 220 are in the ejection-disabled state, actuation of the ejection mechanisms 220 in the first direction does not cause ejection, as described above.) Conversely, the ejection mechanisms 220 can be actuated in a second direction, opposite the first direction, to cause the electronic devices 200 in a position of being at least partially received within the system chassis but not yet in the installed position (e.g., the ejected position) to move into the installed position, thus causing the electronic devices 200 to become electrically connected with the system 300.

In some implementations, the system chassis 382 has a height dimension of $h_3$ and a width dimension of $w_3$ such that the system chassis 382 can fit within two standard rack units (2U). In other words, in implementations in which the system chassis 382 fits within 2U, the height $h_3$ of the system chassis 382 is less than or equal to 3.50 inches (88.90 mm). In some implementations in which the system chassis 382 fits within 2U, the width $w_3$ of the system chassis 382 is less than or equal to 19 inches (482.6 mm), while in some implementations the width $w_3$ is less than or equal to 23 inches (584.2 mm).

For example, in some implementations, the system 380 comprises a 2U data storage system. In such implementations, the electronic devices 200 received in the system chassis 382 may comprise IOMs which are configured to receive pluggable devices 216 in the form of OCP-compliant HBAs. Furthermore, in such implementations the system 380 further comprises one or more data storage devices, such as solid-state drives or hard-disk drives. For example, the electronic devices 200 may be arranged at a rear face of the system chassis 382 whereas the data storage devices may be housed near a front face of the system chassis 382, opposite the rear face. The system 380 may also further comprise one or more compute nodes, which may comprise one or more processors.

In the description above, various types of electronic circuitry or devices are described. As used herein, "electronic" is intended to be understood broadly to include all types of circuitry/devices utilizing electricity, including digital and analog circuitry, direct current (DC) and alternating current (AC) circuitry, and circuitry/devices for converting electricity into another form of energy and circuitry/devices for using electricity to perform other functions. In other words, as used herein there is no distinction between "electronic" circuitry/devices and "electrical" circuitry/devices. In some cases, certain electronic circuitry/devices may comprise processing circuitry. Processing circuitry comprises circuitry configured with logic for performing various operations. The logic of the processing circuitry may comprise dedicated hardware to perform various operations, software (machine readable and/or processor executable instructions) to perform various operations, or any combination thereof. In implementations in which the logic comprises software, the processing circuitry may include a processor to execute the software instructions and a memory device that stores the software. The processor may comprise one or more processing devices capable of executing machine readable instructions, such as, for example, a processor, a processor core, a central processing unit (CPU), a controller, a microcontroller, a system-on-chip (SoC), a digital signal processor (DSP), a graphics processing unit (GPU), etc. In cases in which the processing circuitry includes dedicated hardware, in addition to or in lieu of the processor, the dedicated hardware may include any electronic device that is configured to perform specific operations, such as an Application Specific Integrated Circuit (ASIC), a Field Programmable Gate Array (FPGA), a Complex Programmable Logic Device (CPLD), discrete logic circuits, a hardware accelerator, a hardware encoder, etc. The processing circuitry may also include any combination of dedicated hardware and processor plus software.

It is to be understood that both the general description and the detailed description provide example implementations that are explanatory in nature and are intended to provide an understanding of the present disclosure without limiting the scope of the present disclosure. Other examples in accordance with the present disclosure will be apparent to those skilled in the art based on consideration of the disclosure herein. For example, various mechanical, compositional, structural, electronic, and operational changes may be made to the disclosed examples without departing from the scope of this disclosure, including for example the addition, removal, alteration, substitution, or rearrangement of elements of the disclosed examples, as would be apparent to one skilled in the art in consideration of the present disclosure. Moreover, it will be apparent to those skilled in the art that certain features or aspects of the present teachings may be utilized independently (even if they are disclosed together in some examples) or may be utilized together (even if disclosed in separate examples), whenever practical. In some instances, well-known circuits, structures, and techniques have not been shown or described in detail in order not to obscure the examples. Thus, the following claims are intended to be given their fullest breadth, including equivalents, under the applicable law, without being limited to the examples disclosed herein.

References herein to examples, implementations, or other similar references should be understood as referring to prophetic or hypothetical examples, rather than to devices that have been actually produced (e.g., prototypes), unless explicitly indicated otherwise. Similarly, references to qualities or characteristics of examples should be understood as estimates or expectations based on an understanding of the relevant physical principles involved, application of theory or modeling, and/or past experiences of the inventors, rather than as the results of tests carried out on a physical device, unless explicitly indicated otherwise.

Further, spatial, positional, and relational terminology used herein is chosen to aid the reader in understanding examples of the invention but is not intended to limit the invention to a particular reference frame, orientation, or positional relationship. For example, spatial, positional, and relational terms such as "up", "down", "lateral", "beneath", "below", "lower", "above", "upper", "proximal", "distal", and the like may be used herein to describe directions or to describe one element's or feature's spatial relationship to another element or feature as illustrated in the figures. These spatial terms are used relative to reference frames in the figures and are not limited to a particular reference frame in the real world. Furthermore, if a different reference frame is considered than the one illustrated in the figures, then the spatial terms used herein may need to be interpreted differently in that different reference frame. Moreover, the poses of items illustrated in the figure are chosen for convenience of illustration and description, but in an implementation in practice the items may be posed differently.

In addition, the singular forms "a", "an", and "the" are intended to include the plural forms as well, unless the context indicates otherwise. Moreover, the terms "comprises", "comprising", "includes", and the like specify the presence of stated features, steps, operations, elements, and/or components but do not preclude the presence or addition of one or more other features, steps, operations, elements, components, and/or groups. Components described as coupled may be electronically or mechanically directly coupled, or they may be indirectly coupled via one or more intermediate components, unless specifically noted otherwise.

And/or: Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

Mathematical and geometric terms are not necessarily intended to be used in accordance with their strict definitions unless the context of the description indicates otherwise, because a person having ordinary skill in the art would understand that, for example, a substantially similar element that functions in a substantially similar way could easily fall within the scope of a descriptive term even though the term also has a strict definition. Moreover, unless otherwise noted herein or implied by the context, when terms of approximation such as "substantially," "approximately," "about," "around," "roughly," and the like, are used, this should be understood as meaning that mathematical exactitude is not required and that instead a range of variation is being referred to that includes but is not strictly limited to the stated value, property, or relationship. In particular, in addition to any ranges explicitly stated herein (if any), the range of variation implied by the usage of such a term of approximation includes at least any inconsequential variations and also those variations that are typical in the relevant art for the type of item in question due to manufacturing or other tolerances. In any case, the range of variation may include at least values that are within +1% of the stated value, property, or relationship unless indicated otherwise.

What is claimed is:

1. A device, comprising:
a chassis configured to house an electronic component and to be removably received within a system chassis of an electronic system; and
an ejection mechanism coupled to the chassis and comprising an actuatable portion, an engagement portion, and a link transitionable between a first state and a second state,
wherein the engagement portion is configured to, on condition of the chassis being received within the system chassis, engage with the system chassis such that actuation of the engagement portion in a first direction moves the chassis from an installed position into an ejected position relative to the system chassis;
wherein in the first state of the link, actuation of the actuatable portion in the first direction causes actuation of the engagement portion in the first direction, and
wherein in the second state of the link, actuation of the actuatable portion in the first direction does not cause actuation of the engagement portion in the first direction.

2. The device of claim 1,
wherein in the first state of the link, the link operably couples the actuatable portion to the engagement portion such that actuation of the actuatable portion in the first direction is converted by the link into actuation of the engagement portion in the first direction, and
wherein in the second state of the link, the link does not operably couple the actuatable portion to the engagement portion.

3. The device of claim 1, further comprising:
the electronic component housed in the chassis,
wherein in the installed position of the chassis relative to the system chassis, the electronic component is electrically connected to the electronic system, and
wherein in the ejected position of the chassis relative to the system chassis, the electronic component is electrically disconnected from the electronic system.

4. The device of claim 1,
wherein the actuatable portion comprises a lever arm and the engagement portion comprises a cam.

5. The device of claim 4,
wherein the link comprises a button, and
wherein the link is transitionable to the second state by depressing the button and the link is transitionable to the first state by releasing the button.

6. The device of claim 5,
wherein the link further comprises at least one cam engagement feature extending from the button and engaged with the cam to constrain the cam to move with the button, and
wherein the button is configured to:
interfere with the lever arm while the link is in the first state, and
not interfere with the lever arm while the link is in the second state.

7. The device of claim 6,
wherein the button is configured to, in the second state of the link, pass under the lever arm as the lever arm is actuated in the first direction; and
wherein the at least one cam engagement feature is configured to engage with chassis in the second state of the link to hold the cam stationary relative to the chassis.

8. The device of claim 4,
wherein the lever arm and the cam are pivotably coupled to a pivot pin,
wherein actuation of the lever arm comprises pivoting the lever arm about the pivot pin, and
wherein actuation of the cam comprises pivoting the cam about the pivot pin.

9. The device of claim 8,
wherein the cam further comprises one or more teeth extending radially from the cam, and
wherein the one or more teeth are configured to engage with the system chassis, on condition of the chassis being received within the system chassis, such that the one or more teeth convert pivoting of the cam into translational motion of the chassis relative to the system chassis.

10. The device of claim 4,
wherein actuation of the lever arm in the first direction comprises moving a free end of the lever arm away from the chassis; and
wherein actuation of the lever arm in a second direction comprises moving a free end of the lever arm toward the chassis.

11. The device of claim 10,
wherein the cam comprises a lever arm engagement feature configured to transfer motion of the lever arm in the second direction to the cam and to not transfer motion of the lever arm in the first direction to the cam unless the link is in the first state; and
wherein, in a state of the chassis at least partially received within the system chassis but not in the installed position, actuation of the cam in the second direction moves the chassis into the installed position relative to the system chassis.

12. The device of claim 1,
wherein the device comprises an input-output module and the electronic system comprises a data storage system.

13. The device of claim 12,
wherein the chassis comprises at least four receptacles configured to removably receive at least four open compute project compliant host bus adapters; and
wherein the chassis has a height equal to or smaller than 1.75 inches.

14. A computing system, comprising:
a system chassis configured to receive a plurality of electronic devices; and
the device of claim 1, wherein the device is received within the system chassis.

15. A device, comprising:
a chassis configured to be removably received within a system chassis of an electronic system; and
an ejection mechanism coupled to the chassis and reversibly configurable between a first state and a second state,
wherein the ejection mechanism is configured to, on condition of the chassis being received in the system chassis in an installed position, engage with the system chassis such that:
  in the first state, actuation of an actuatable portion of the ejection mechanism from a first position to a second position moves the chassis from the installed position to an ejected position relative to the system chassis, and
  in the second state, actuation of the actuatable portion of the ejection mechanism from the first position to the second position does not move the device into the ejected position.

16. The device of claim 15,
wherein in a state of the chassis at least partially received within the system chassis but not in the installed position, actuation of the actuatable portion of the ejection mechanism from the second position to the first position moves the chassis into the installed position.

* * * * *